United States Patent
Wheeler

(10) Patent No.: US 10,253,559 B2
(45) Date of Patent: Apr. 9, 2019

(54) ENERGY-HARVESTING CHROMOGENIC DEVICES

(71) Applicant: Alliance for Sustainable Energy, LLC, Golden, CO (US)

(72) Inventor: Lance M. Wheeler, Wheat Ridge, CO (US)

(73) Assignee: Alliance for Sustainable Energy, LLC, Golden, CO (US)

(*) Notice: Subject to any disclaimer, the term of this patent is extended or adjusted under 35 U.S.C. 154(b) by 16 days.

(21) Appl. No.: 15/279,062

(22) Filed: Sep. 28, 2016

(65) Prior Publication Data

US 2017/0089128 A1 Mar. 30, 2017

Related U.S. Application Data

(60) Provisional application No. 62/234,472, filed on Sep. 29, 2015.

(51) Int. Cl.
| | |
|---|---|
| *G02F 1/03* | (2006.01) |
| *G02F 1/07* | (2006.01) |
| *G02F 1/01* | (2006.01) |
| *E06B 9/24* | (2006.01) |
| *C03C 4/06* | (2006.01) |

(Continued)

(52) U.S. Cl.
CPC ............... *E06B 9/24* (2013.01); *C03C 4/06* (2013.01); *G02F 1/15* (2013.01); *E06B 2009/2464* (2013.01); *E06B 2009/2476* (2013.01); *G02F 1/0126* (2013.01); *G02F 1/0147* (2013.01); *G02F 1/153* (2013.01); *G02F 1/155* (2013.01); *G02F 1/1533* (2013.01); *G02F 2201/08* (2013.01); *G02F 2201/086* (2013.01); *G02F 2202/36* (2013.01); *G02F 2203/11* (2013.01); *G02F 2203/62* (2013.01);

(Continued)

(58) Field of Classification Search
CPC ........ G02F 1/1523; G02F 1/163; G02F 1/153; G02F 1/15; G02F 1/0147; G02F 1/1506; G02F 1/1525; G02F 1/1508; G02F 1/157; G02F 1/0018; G02F 1/13439; G02F 2001/1512; G02F 2001/1515; G02F 2001/1519; G02F 2202/36; G02F 2203/62
USPC .................................................. 359/241–320
See application file for complete search history.

(56) References Cited

U.S. PATENT DOCUMENTS

| | | |
|---|---|---|
| 3,507,563 A | 4/1970 | Berman et al. |
| 7,660,029 B2 | 2/2010 | Ashrit et al. |

(Continued)

OTHER PUBLICATIONS

Arima et al., "Variation of optical gaps in perovskite-type 3d transition-metal oxides," Physical Review B, vol. 48, No. 23, Dec. 15, 1993-I, pp. 17 006-17 009.

(Continued)

*Primary Examiner* — Mahidere S Sahle
(74) *Attorney, Agent, or Firm* — Michael A. McIntyre

(57) ABSTRACT

An aspect of the present disclosure is a device that includes a switchable material and an intercalating species, such that when a first condition is met, at least a portion of the intercalating species is associated with the switchable material and the switchable material is substantially transparent and substantially colorless, and when a second condition is met, at least a fraction of the portion of the intercalating species is transferred from the switchable material and the switchable material is substantially transparent and substantially colored.

26 Claims, 22 Drawing Sheets

(51) Int. Cl.
G02F 1/15 (2019.01)
G02F 1/153 (2006.01)
G02F 1/155 (2006.01)
H01L 51/00 (2006.01)
H01L 51/42 (2006.01)

(52) U.S. Cl.
CPC ...... H01L 51/0077 (2013.01); H01L 51/0083 (2013.01); H01L 51/4213 (2013.01)

(56) References Cited

U.S. PATENT DOCUMENTS

| | | | |
|---|---|---|---|
| 8,154,029 | B2 | 4/2012 | Millett et al. |
| 8,341,045 | B2 | 12/2012 | Kravitz et al. |
| 2006/0172135 | A1 | 8/2006 | Agrawal et al. |
| 2008/0092456 | A1 | 4/2008 | Millett et al. |
| 2009/0283728 | A1 | 11/2009 | Byker et al. |
| 2010/0132770 | A1 | 6/2010 | Beatty et al. |
| 2011/0249314 | A1* | 10/2011 | Wang .......... G02F 1/1523 359/265 |
| 2012/0029258 | A1 | 2/2012 | Wohl et al. |
| 2013/0003157 | A1 | 1/2013 | Wang et al. |
| 2014/0327952 | A1 | 11/2014 | Anderson et al. |
| 2015/0129034 | A1 | 5/2015 | Snaith et al. |
| 2016/0139476 | A1* | 5/2016 | Garcia .......... G02F 1/0123 359/275 |
| 2017/0089128 | A1 | 3/2017 | Wheeler |
| 2018/0059440 | A1 | 3/2018 | Yu et al. |

OTHER PUBLICATIONS

Gao et al., "Organohalide lead perovskites for potovoltaic applications," Energy & Environmental Science, vol. 7, 2014, pp. 2448-2463.
Halder et al., "Exploring Thermochromic Behavior of Hydrated Hybrid Perovskites in Solar Cells," American Chemical Society, Journal of Physical Chemistry Letters, vol. 6, 2015, pp. 3180-3184.
Hao et al., "Lead-free solid-state organic-inorganic halide perovskite solar cells," Nature Photonics, vol. 8, Jun. 2014, pp. 489-494.
Mitzi et al., "Organic-Inorganic Electronics," IBM Journal of Research and Development, vol. 45, No. 1, Jan. 2001, pp. 29-45.
Raw et al., "Syntheses and structure of hydrothermally prepared $CsNiX_3$ (X-Cl, Br, I)," Journal of Solid State Chemistry, vol. 192, 2012, pp. 34-37.
Tanaka et al., "Bandgap and exciton binding energies in lead-iodide-based natural quantum-well crystals," Science and Technology of Advanced Materials, vol. 4, 2003, pp. 599-604.
Zhao et al., "Optical bleaching of perovskite $(CH_3NH_3)PbI_3$ through room-temperature phase transformation induced by ammonia," The Royal Society of Chemistry, Chemical Communication, vol. 50, 2014, pp. 1605-1607.
Granqvist, C.G., "Electrochromic devices," Journal of the European Ceramic Society, vol. 25, Issue 12, 2005, pp. 1-13.
Heo et al., "Flexible Reflective Color Displays using Thermochromic Pigments," Journal of the Optical Society of Korea, vol. 17, No. 5, Oct. 2013, pp. 428-432.
Jeon et al., "Compositional engineering of perovskite materials for high-performance solar cells," Nature Letter, vol. 517, Jan. 22, 2015, pp. 476-480.
Kuroiwa et al., "Heat-Set Gel-like Networks of Lipophilic Co(II) Triazole Complexes in Organic Media and Their Thermochromic Structural Transitions," Journal of American Chemical Society, vol. 126, No. 7, 2004, pp. 2016-2021.
Passerini et al., "The Intercalation of Lithium in Nickel Oxide and Its Electrochromic Properties," Journal of Electrochemical Society, vol. 137, No. 10, Oct. 1990, pp. 3297-3300.
Sun et al., "Influence of water on the electrochemical properties of $(CeO_2)_x(TiO_2)_{1-x}$ and $WO_3$ sol-gel coatings and electrochromic devices," Solid State Ionics, vol. 165, 2003, pp. 181-189.
Wittwer et al., "Gasochromic windows," Solar Energy Materials and Solar Cells, vol. 84, Issues 1-4, Oct. 2004, pp. 305-314.
International Search Report from corresponding PCT/US16/54188, three pages.
Beal et al., "Cesium Lead Halide Perovskites with Improved Stability for Tandem Solar Cells," The Journal of Physical Chemistry Letters, vol. 7, 2016, pp. 746-751.
Bryant et al., "A Transparent Conductive Adhesive Laminate Electrode for High-Efficiency Organic-Inorganic Lead Halide Perovskite Solar Cells," Advanced Materials, vol. 26, 2014, pp. 7499-7504.
Cottingham et al., "Compositionally Dependent Phase Identity of Colloidal $CsPbBr_3$—xIx Quantum Dots," Chemistry of Materials, vol. 28, 2016, pp. 7574-7577.
Davy et al., "Pairing of near-ultraviolet solar cells with electrochromic windows for smart management of the solar spectrum," Nature Energy, vol. 2, 2017, pp. 17104-17110.
Gorgolis et al., "Solar energy materials for glazing technologies," Solar Energy Materials & Solar Cells, vol. 144, 2016, pp. 559-578.
Habisreutinger et al., "Carbon Nanotube/Polymer Composites as a Highly Stable Hole Collection Layer in Perovskite Solar Cells," Nano Letters, vol. 14, 2014, pp. 5561-5568.
Habisreutinger et al., "Dopant-Free Planar n-i-p Perovskite Solar Cells with Steady-State Efficiencies Exceeding 18%," ACS Energy Letters, vol. 2, 2017, pp. 622-628.
Idigoras et al., "The interaction between hybrid organic-inorganic halide perovskite and selective contacts in perovskite solar cells: an infrared spectroscopy study," Phys. Chem. Chem. Phys., vol. 18, 2016, pp. 13583-13590.
Lau et al., "$CsPbIBr_2$ Perovskite Solar Cell by Spray-Assisted Deposition," ACS Energy Letters, vol. 1, 2016, pp. 573-577.
Li et al., "Stabilizing Perovskite Structures by Tuning Tolerance Factor: Formation of Formamidinium and Cesium Lead Iodide Solid-State Alloys," ACS Chemistry of Materials, vol. 28, 2016, pp. 284-292.
Nenon et al., "Structural and chemical evolution of methylammonium lead halide perovskites during thermal processing from solution," Energy & Environmental Science, vol. 9, 2016, pp. 2072-2082.
Noel et al., "A low viscosity, low boiling point, clean solvent system for the rapid crystallisation of highly specular perovskite films," Energy & Environmental Science, vol. 10, 2017, pp. 145-152.
Norton-Baker et al., "Polymer-Free Carbon Nanotube Thermoelectrics with Improved Charged Carrier Transport and Power Factor," ACS Energy Letters, vol. 1, 2016, pp. 1212-1220.
Ouyang et al., "Conducting Polymer as Transparent Electric Glue," Advanced Materials, vol. 18, 2006, pp. 2141-2144.
Pang et al., "Transformative Evolution of Organolead Triiodide Perovskite Thin Films from Strong Room-Temperature Solid-Gas Interaction between $HPbI_3$—$CH_3NH_2$ Precursor Pair," Journal of the American Chemical Society, vol. 138, 2016, pp. 750-753.
Pfeiffer et al., "Controlled doping of phthalocyanine layers by cosublimation with acceptor molecules: A systematic Seebeck and conductivity study," Applied Physics Letters, vol. 73, No. 22, Nov. 30, 1998, pp. 3202-3204.
Sharma et al., "Phase Diagrams of Quasibinary Systems of the Type: ABX3-A'BX3; ABX3-AB'X3, and ABX3-ABX'3; X=Halogen," Zeitschrift für Physikalische Chemie, 1992, pp. 63-80.
Treml et al., "Quantitative Framework for Evaluating Semitransparent Photovoltaic Windows," ACS Energy Letters, vol. 1, 2016, pp. 391-394.
Yangui et al., "Rapid and robust spatiotemporal dynamics of the first-order phase transition in crystals of the organic-inorganic perovskite (C12H25NH3)2PbI4," Scientific Reports, 5:16634, pp. 1-10.
You et al., "Low-Temperature Solution-Processed Perovskite Solar Cells with High Efficiency and Flexibility," ACS Nano, vol. 8, No. 2, 2014, pp. 1674-1680.
Zong et al., "Thin-Film Transformation of NH4PbI3 to CH3NH3PbI3 Perovskite: A Methylamine-Induced Conversion-Healing Process," Angewandte Chemie International Edition, vol. 55, 2016, pp. 14723-14727.

(56) References Cited

OTHER PUBLICATIONS

Cannavale et al., "Forthcoming perspectives of photoelectrochromic devices: a critical review," Energy Environ. Sci., 2016, vol. 9, pp. 2682-2719.
Eperon et al., "Neutral Color Semitransparent Microstructured Perovskite Solar Cells," ACS Nano, 2014, vol. 8, No. 1, pp. 591-59.
Huang et al., "Direct Observation of Reversible Transformation of $CH_3NH_3PbI_3$ and $NH_4PbI_3$ Induced by Polar Gaseous Molecules," Journal of Physical Chemistry Letters, 2016, vol. 7, pp. 5068-5073.
Leguy et al., "Reversible Hydration of $CH_3NH_3PbI_3$ in Films, Single Crystals, and Solar Cells," Chemistry of Materials, 2015, 11 pages.
Piccolo et al., "Performance requirements for electrochromic smart window," Journal of Building Engineering, 2015, vol. 3, pp. 94-103.
Schubert et al., "Solid-State Light Sources Getting Smart," Science, 2005, vol. 308, 6 pages.
Yuan et al., "Electric-Field-Driven Reversible Conversion Between Methylammonium Lead Triiodide Perovskites and Lead Iodide at Elevated Temperatures," Advanced Materials Views, 2016, vol. 6, 7 pages.
PCT/US18/32088 Search Report dated Jul. 12, 2018; 3 pages.
PCT/US18/32088 Written Opinion, dated Jul. 12, 2018; 6 pages.
Li et al., Correlated Perovskites as a New Platform for Super-Broadband-Tunable Photonics; Advanced Materials, vol. 28, Issue 41, Nov. 2, 2016, 9 pages.
NREL Energy Innovation Portal, "Design and Fabrication of Thermochromic Energy-Harvesting Windows," http://techportal.eere.energy.gov/technology.do/techID=1373, accessed Apr. 18, 2018, 2 pages.
International Search Report from PCT patent application No. PCT/US18/19972, dated May 30, 2018, 2 pages.
Written Opinion of the International Searching Authority from PCT patent application No. PCT/US18/19972, dated May 30, 2018, 7 pages.

* cited by examiner

ENERGY-HARVESTING CHROMOGENIC DEVICES

CROSS-REFERENCE TO RELATED APPLICATIONS

This application claims the benefit of U.S. Provisional Application No. 62/234,472 filed Sep. 29, 2015, the content of which is incorporated herein by reference in its entirety.

The United States Government has rights in this invention under Contract No. DE-AC36-08GO28308 between the United States Department of Energy and Alliance for Sustainable Energy, LLC, the Manager and Operator of the National Renewable Energy Laboratory.

BACKGROUND

Buildings account for 72% of the total electricity consumption in the United States. Consumption is expected to rise to 75% by 2025. Regulating solar radiation gain through windows plays a pivotal role in decreasing building energy consumption. This is a challenging research endeavor as window energy efficiency and cost must also be balanced with the demand for large high-transmission windows for architectural aesthetics as well as occupant comfort. "Smart" glass technology uniquely addresses this challenge.

Smart windows regulate building solar radiation gain by switching from a transparent state when sun is desired for natural lighting, heating, and/or comfort to a tinted (or reflective) state during seasons and/or times of day when building heat gain is problematic. There are a number of chromogenic current technologies that achieve this, including suspended particle, liquid crystal, and electro-, thermo-, gaso-, photo-, and photoelectro-chromic. The operation of these technologies may be subdivided as "active" or "passive." An active device may be controllably actuated and may be programmed by the building occupant. For example, the user may push a button that applies an electrical bias that switches the device state. This is a desirable feature that adds additional expense and complexity due to the need for additional electrical circuitry. Thermogenic and chromogenic layers typically operate passively where solar radiation may induce switching from transparent to tinted due to high energy light (photochromic) or due to a temperature increase in the layer (thermochromic). This results in lower energy consumption than with standard windows, without the added expense of electrical switching found in electrochromic windows but without the feature of dynamic actuation by the user. The smart glass market is relatively young and is projected to be nearly a one billion-dollar annual industry by 2022. Thus, there remains a need for improved smart glass technologies.

SUMMARY

An aspect of the present disclosure is a device that includes a switchable material and an intercalating species, such that when a first condition is met, at least a portion of the intercalating species is associated with the switchable material and the switchable material is substantially transparent and substantially colorless, and when a second condition is met, at least a fraction of the portion of the intercalating species is transferred from the switchable material and the switchable material is substantially opaque and substantially colored. In some embodiments of the present disclosure, the switchable material may include $ABX_3$, $ABX_4$, or $A_2BX_6$ where A is a first cation, B is a second cation, and X is an anion. In some embodiments of the present disclosure, the first cation may include at least one of a monovalent or a divalent cation. In some embodiments of the present disclosure, the second cation may include a metal that is in at least one of a 2+ oxidation state or a 4+ oxidation state. In some embodiments of the present disclosure, the anion may include at least one of a halide or an oxide/chalcogenide.

In some embodiments of the present disclosure, the switchable material may include $ABX_3$, wherein A is $CH_3NH_3^+$, B includes at least one of lead and/or nickel, and X includes at least one of iodine and/or bromine. In some embodiments of the present disclosure, the intercalating species may include at least one of $H_2O$, $NH_3$, $RNH_2$, $RR'NH$, $ROH$, $CO$, and/or $CO_2$, where R and R' are organic functional groups. In some embodiments of the present disclosure, the intercalating species may include at least one of $NH_3$, $H_2O$, and/or $CH_3NH_2$. In some embodiments of the present disclosure, the first condition may be achieved when the switchable material attains a first temperature below about 25° C. In some embodiments of the present disclosure, the second condition may be achieved when the switchable material attains a second temperature above about 25° C.

In some embodiments of the present disclosure, when the device is in the second condition, the switchable material may be colored black, green, or red. In some embodiments of the present disclosure, when the device is in the first condition, the switchable material may be transparent to light having a wavelength substantially within the visible spectrum. In some embodiments of the present disclosure, when the device is in the second condition, the switchable material may absorb at least a portion of light in the visible spectrum. In some embodiments of the present disclosure, the device may further include an intercalating species reservoir, where the switchable material may be in the form of a layer, the intercalating species reservoir may be positioned adjacent to a first surface of the layer, and the fraction of the portion of the intercalating species that is removed from the layer is reversibly stored in the intercalating species reservoir. In some embodiments of the present disclosure, the intercalating species reservoir may include at least one of an empty volume and/or a reversibly adsorbing material.

In some embodiments of the present disclosure, the device may further include a first transparent conducting oxide layer and a second transparent conducting oxide layer, where the switchable layer is positioned between the first transparent conducting oxide layer and the second conducting oxide layer, and the first transparent conducting layer is positioned between the intercalating species reservoir and the switchable layer. In some embodiments of the present disclosure, the first transparent conducting layer may be configured to allow the reversible transfer of the intercalating species from the switchable layer to the intercalating species reservoir, and from the intercalating species reservoir to the switchable layer.

In some embodiments of the present disclosure, the device may further include a switching mechanism having a first position and a second position, where when in the first position, the first condition is met, and when in the second position, the second condition is met. In some embodiments of the present disclosure, the switching mechanism may include a light source, such that when in the first position, the light is off, and when in the second position, the light is on. In some embodiments of the present disclosure, the switching mechanism may include a flow of gas, where the flow of gas is in contact with a surface of the switchable layer, where the first position of the switching mechanism is when the gas has a concentration of the intercalating species above a target concentration, and the second position of the switching mechanism is when the gas has a concentration of the intercalating species less than or equal to the target concentration. In some embodiments of the present disclosure, the switching mechanism may include a voltage source applied to the device, such that the first position of the switching mechanism is when the voltage source does not apply a voltage to the device, and the second position of the switching mechanism is when the voltage source applies a voltage to the device.

An aspect of the present disclosure is a method that includes reversibly switching a material between a first state and a second state by applying a first condition to the material resulting in the first state characterized by the intercalating of a plurality of species into the material, and applying a second condition to the material resulting in the second state characterized by the removing of at least a portion of the plurality of species from the material, where when in the first state, the material is substantially transparent to light in the visible spectrum, and when in the second state, the material is substantially opaque to light in the visible spectrum. In some embodiments of the present disclosure, the second condition may be achieved by applying radiant energy to the material. In some embodiments of the present disclosure, the first condition may include equilibrating the material to a first temperature between about 0° C. and about 25° C. In some embodiments of the present disclosure, the second condition may include equilibrating the material to a second temperature above about 35° C. In some embodiments of the present disclosure, the method may further include, when removing the at least a portion of the plurality of species, transporting the at least a portion of the plurality of species to a species reservoir.

DRAWINGS

Some embodiments of the present disclosure are illustrated in the referenced figures of the drawings. It is intended that the embodiments and figures disclosed herein are to be considered illustrative rather than limiting.

Figure 8:
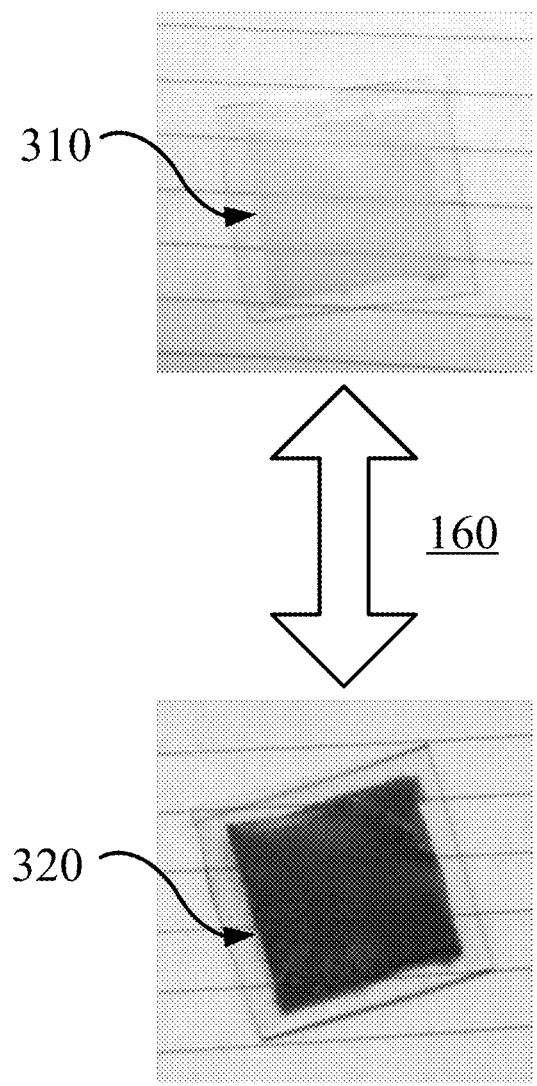

FIG. 8 illustrates a switchable layer that is reversibly switchable between a first state 310 that is transparent and a second state 320 that is opaque, according to some embodiments of the present disclosure: the top photograph is of a transparent, hydrated $MANiI_y$ layer deposited on glass before thermal annealing. The bottom photograph of is of a $MANiI_y$ layer after annealing to 50° C. to switch the layer from transparent to tinted (opaque). After cooling, the layer returned to the transparent state 310.

Figure 9:
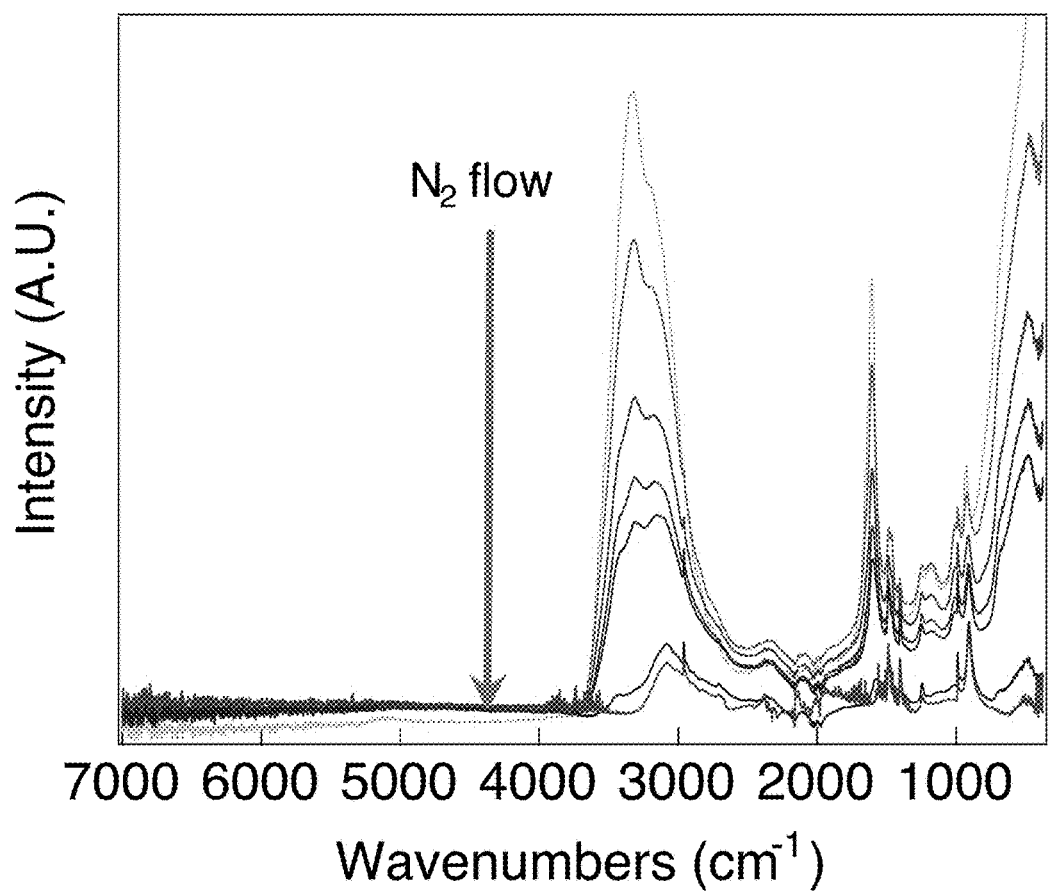

FIG. 9 illustrates the FTIR spectra of a transparent hydrated $MANiI_y$ layer as dry $N_2$ was passed over the layer to transfer the water to the vapor phase and yield a black, tinted $MANiI_y$ layer, according to some embodiments of the present disclosure.

Figure 10:
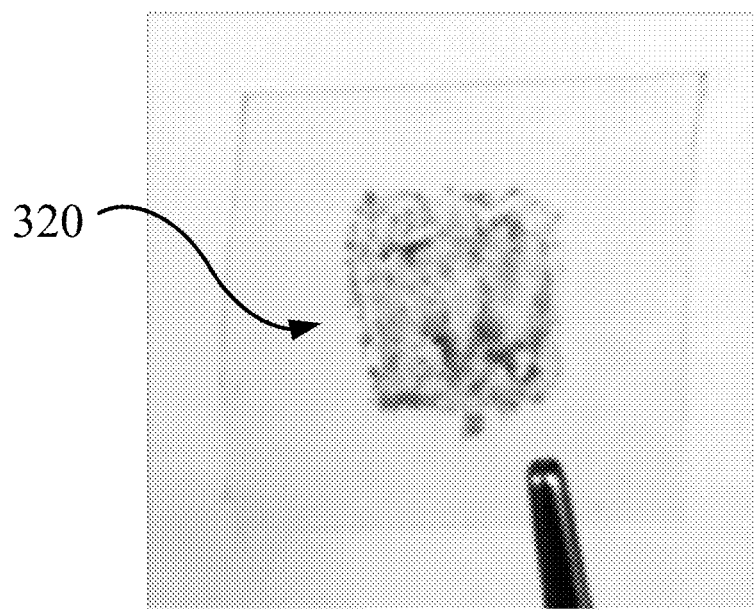

FIG. 10 illustrates a switchable layer in its second tinted state 320 having a green color, where the layer is a $HANi_{1-x}Br_y$ layer formed by drop-casting on a glass substrate layer and annealing to 50° C., according to some embodiments of the present disclosure.

Figure 11:
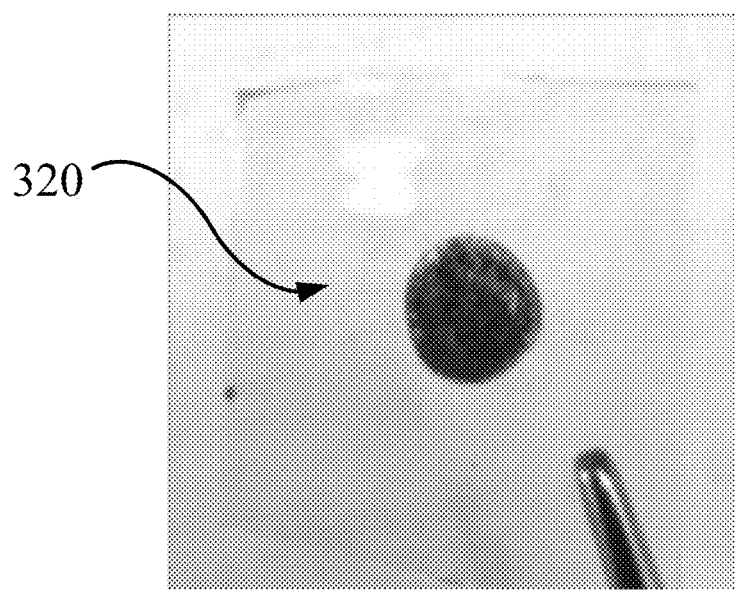

FIG. 11 illustrates a switchable layer in its second tinted state 320 having a red color, where the layer is a $HANiI_y$ layer formed by drop-casting on a glass substrate layer and annealing to 50° C., according to some embodiments of the present disclosure.

Figure 12:
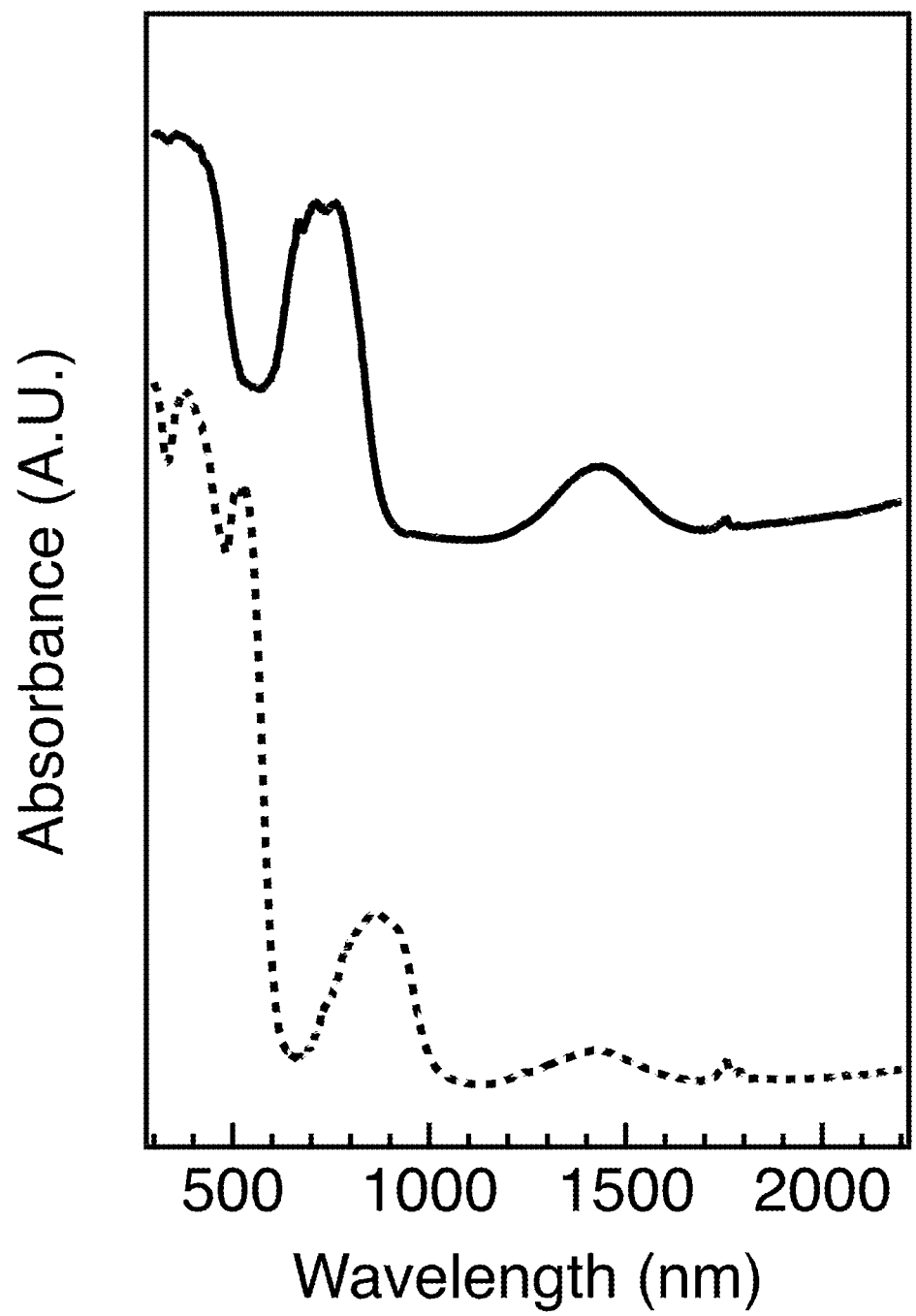

FIG. 12 illustrates the FTIR spectra of the switchable layers illustrated in FIGS. 10 and 11.

Figure 13:
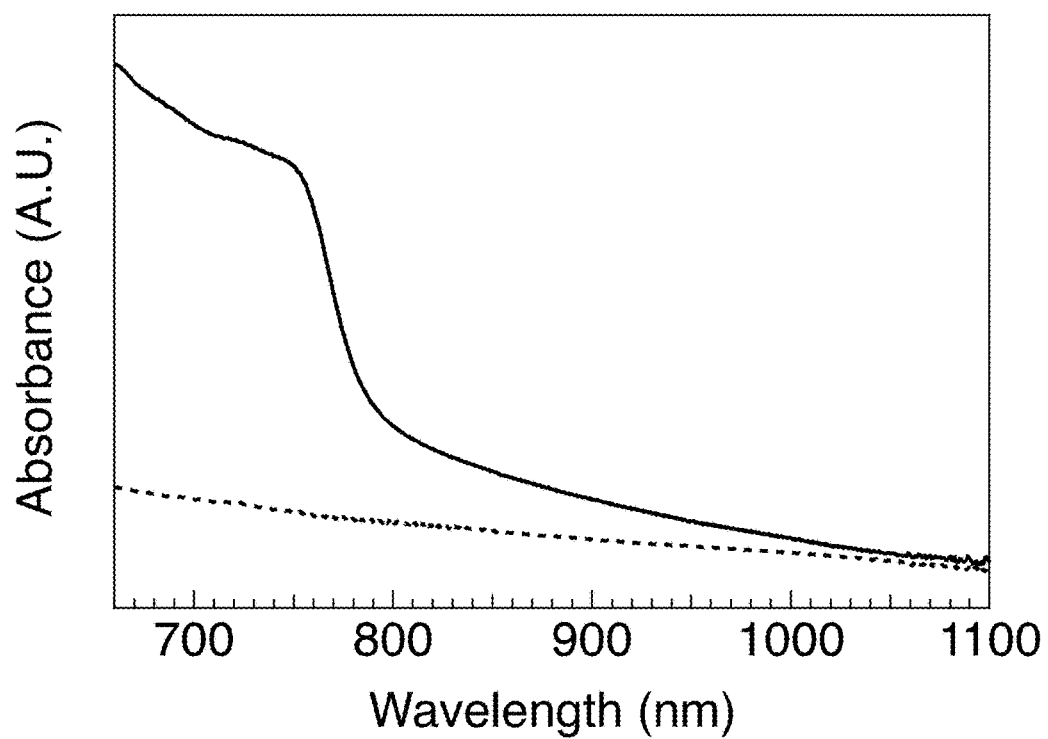

FIG. 13 illustrates the absorption spectra of a $CH_3NH_3PbI_3$ switchable layer when in the tinted state and after the introduction of $CH_3NH_2$ as an intercalating species into the layer ($MAlPbI_3$-$xCH_3NH_2$) to produce the transparent state of the switchable layer, according to some embodiments of the present disclosure.

Figure 14:
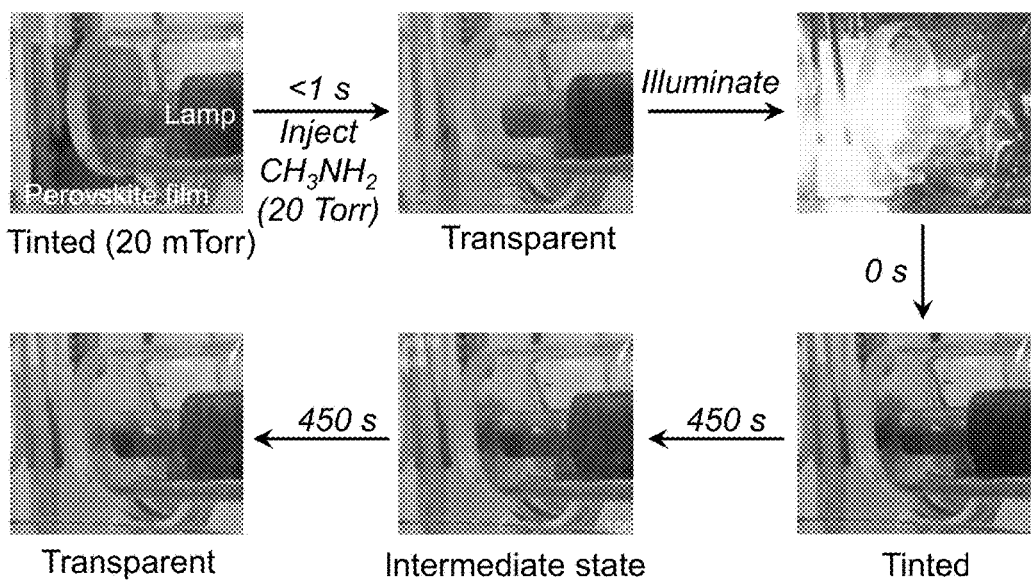

FIG. 14 illustrates still-frame images taken from a movie of a passive switching mechanism for switching a $CH_3NH_3PbI_3$ layer between two states by irradiating the layer with a Xenon lamp, according to some embodiments of the present disclosure. The film dynamically switched between transparent and tinted while under light irradiation.

Figure 15:
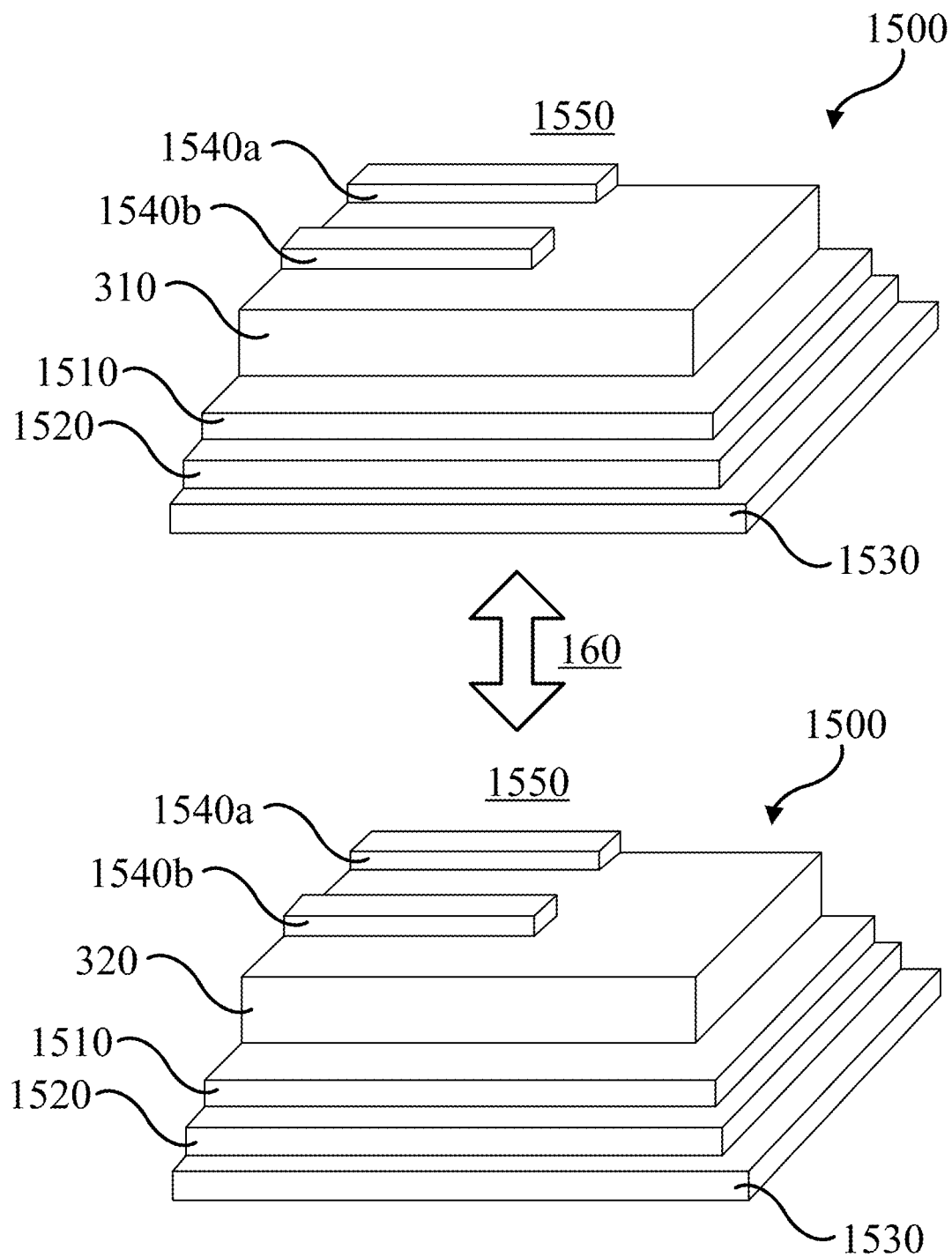

FIG. 15 illustrates a schematic diagram of PV device design based on a switchable $CH_3NH_3PbI_3$ layer that is reversibly switched using $CH_3NH_2$, according to some embodiments of the present disclosure.

Figure 16:
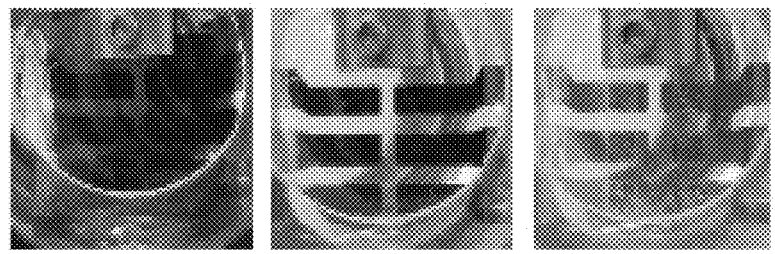
Figure 16:
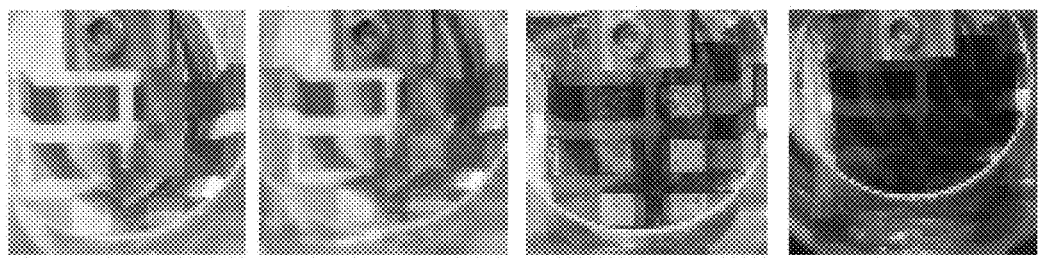

FIG. 16 illustrates photographs of the reversible cycling of a $CH_3NH_3PbI_3$ layer included in a device similar to that illustrated in FIG. 14, according to some embodiments of the present disclosure.

Figure 17:
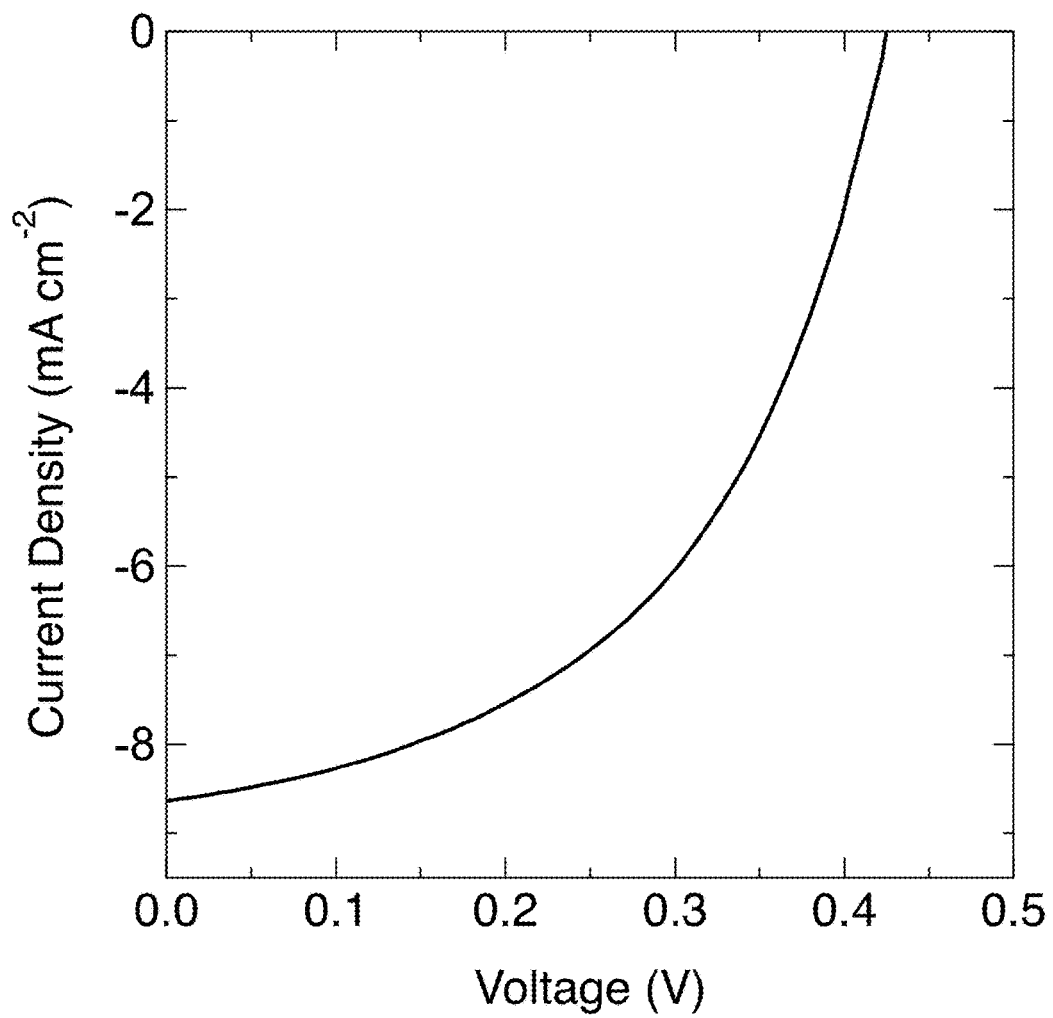

FIG. 17 illustrates a J-V curve of the device after one tinted-to-transparent color cycle of the $CH_3NH_3PbI_3$ layer illustrated in FIG. 14, according to some embodiments of the present disclosure.

Figure 18:
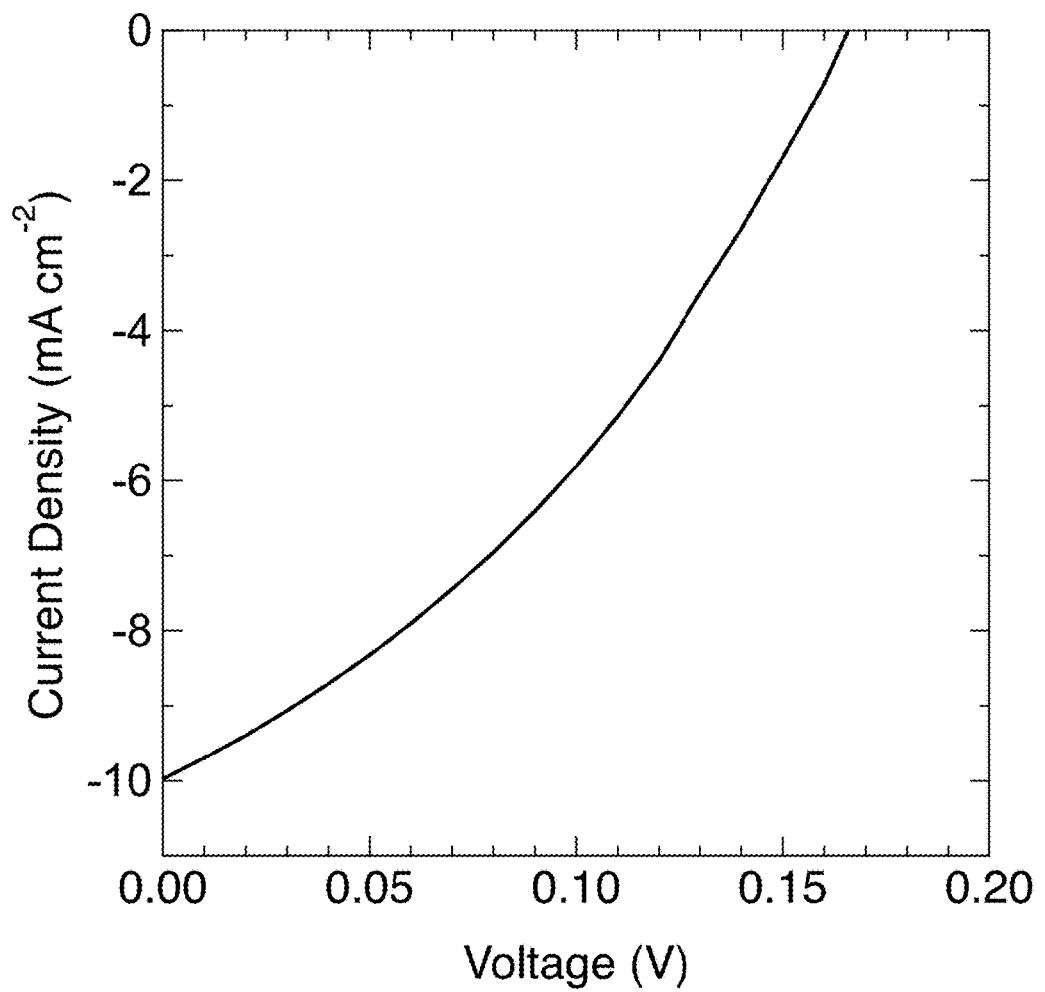

FIG. 18 illustrates a J-V curve of the device after two tinted-to-transparent color cycles of the $CH_3NH_3PbI_3$ layer illustrated in FIG. 14, according to some embodiments of the present disclosure.

Figure 19:
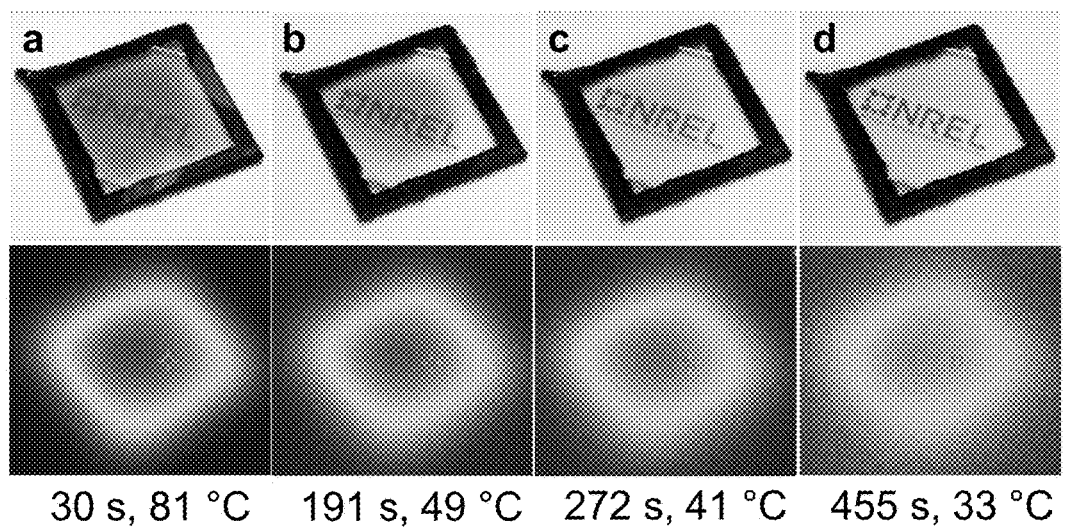

FIG. 19 illustrates optical and accompanying IR images of a switchable device as the device is heated by illumination and allowed to cool, according to some embodiments of the present disclosure.

Figure 20:
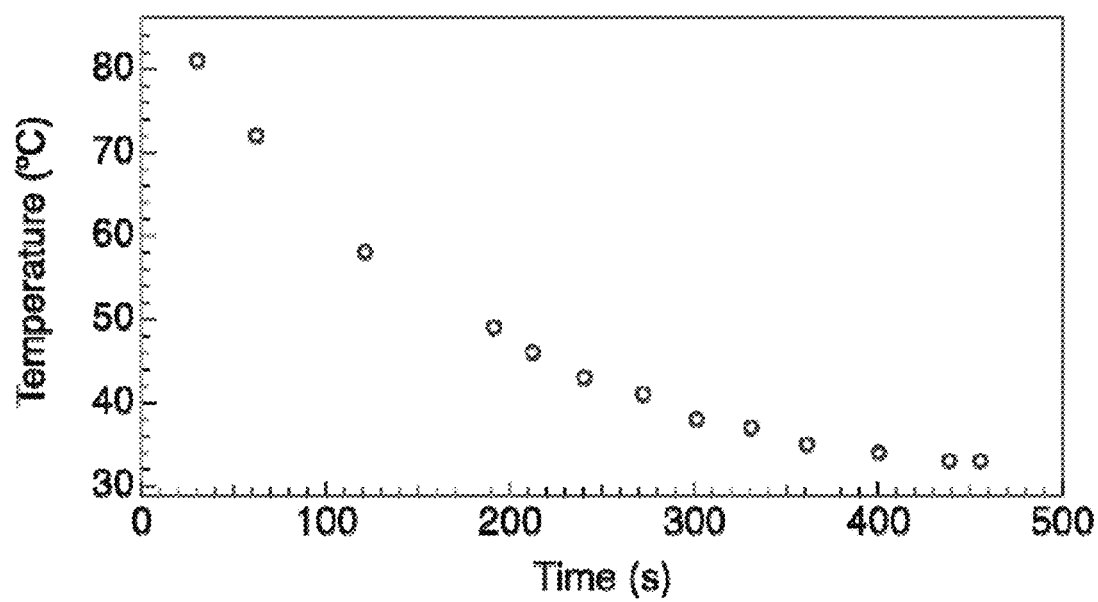

FIG. 20 illustrates the temperature of the device illustrated in FIG. 19 as a function of time after being removed from illumination, according to some embodiments of the present disclosure.

Figure 21:
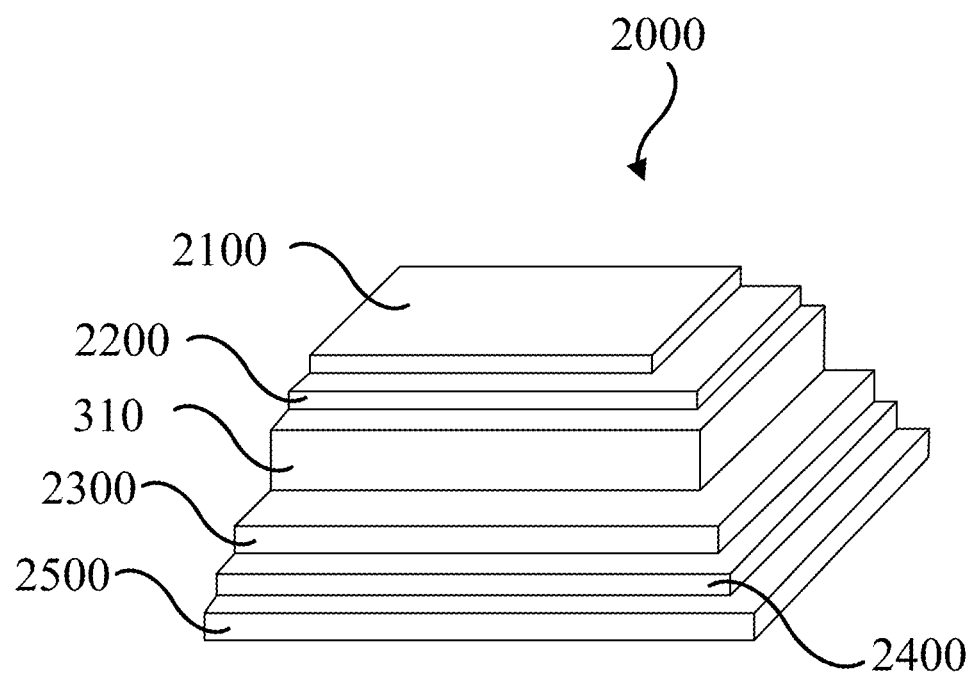

FIG. 21 illustrates a schematic of a photovoltaic (PV) device design based on a switchable perovskite layer and transparent hole transport octakis(4-methoxyphenyl)-9,9-spirobi[9H-fluorene]-2,2,7,7-tetramine (SPIRO-MeOTAD) and conducting layers poly(3,4-ethylenedioythiophene):poly(styrenesulfonate) (PEDOT:PSS) according to some embodiments of the present disclosure.

Figure 22:
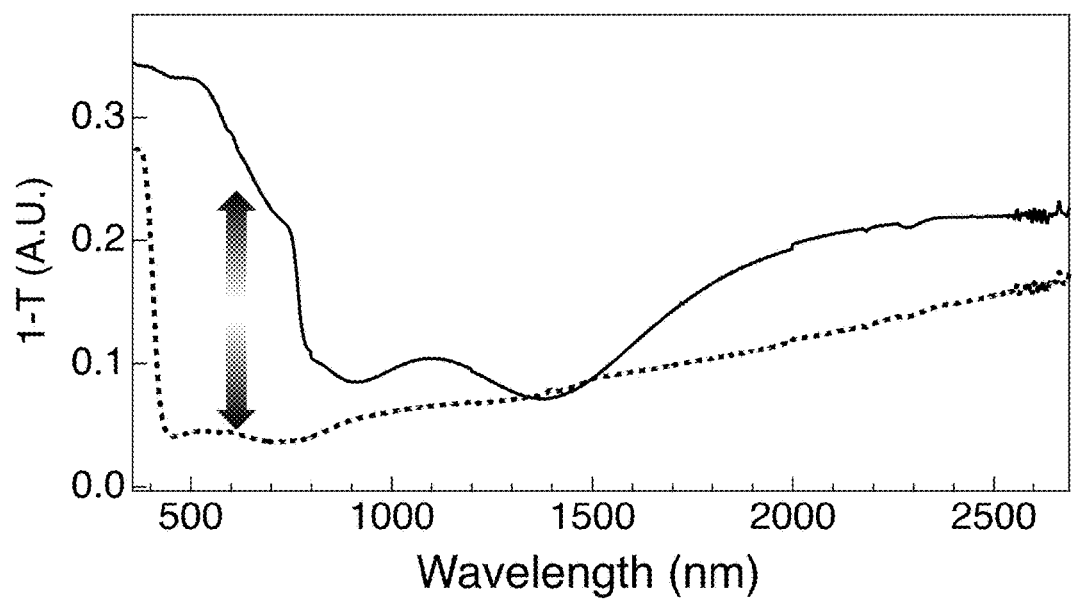

FIG. 22 illustrates the absorption and reflection (1-transmission) spectra as a function of wavelength for a complete device similar to that illustrated in FIG. 21, in the tinted state and in the transparent state, according to some embodiments of the present disclosure.

REFERENCE NUMBERS

100 ... organic-inorganic metal halide perovskite
110 ... A-cation
120 ... B-cation
130 ... anion (X)
200 ... switchable material in first state
210 ... switchable material in second state
220 ... intercalating species
230 ... switching mechanism
300 ... device
310 ... switchable layer in first state
320 ... switchable layer in second state
330 ... intercalating species reservoir
400 ... device
410 ... substrate layer
420 ... intervening layer
430 ... port
500 ... device
600 ... device
610 ... conductor
620 ... carrier transport layer
700 ... method
710 ... applying first condition
720 ... applying second condition
1500 ... photovoltaic (PV) device
1510 ... $TiO_2$ layer
1520 ... fluorine-dope tin oxide (FTO) layer
1530 ... glass substrate layer
1540 ... counter electrode
1550 ... gas space
2000 ... PV device
2100 ... transparent conductor layer
2200 ... hole transport layer
2300 ... $TiO_2$ layer
2400 ... FTO layer
2500 ... glass layer

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

The present disclosure describes the design of devices employing switchable materials that may switch from transparent states to tinted (opaque, reflective) states due to a reversible molecular intercalation mechanism. In addition, in some embodiments of the present disclosure, switchable devices are described that can switch transparency states and also harness solar radiation to provide electricity to the building or grid. As described herein, a switchable material, for example an optical layer, may be intercalated with intercalating species such that the switchable material achieves a first transparent state. Switching from this transparent state to a second, tinted state occurs due to the transport of the intercalating species from the switchable material to a separate and distinct intercalating species reservoir positioned external to the switching material. An intercalating species reservoir can be, for example, a neighboring solid film that reversibly binds the intercalating species, a gas space where the intercalating species exists in the vapor phase, and/or any other suitable material (e.g. gas, liquid, and/or solid) configured for the reversible storage of the intercalating species. In addition to serving as a reservoir and/or receiver for decalated and/or intercalated species, respectively, a gas space may also serve as a sound and/or thermal barrier. A gas space may be above or below atmospheric pressure and may be filled with a chemically inert and/or low-thermal conductivity gas such as argon. Switching of the switchable material between its two states may be induced by an energy input into the device containing the switchable material such as solar radiation and/or any other suitable energy source and/or heat source. Other switching mechanisms may include introducing an electrical bias and/or subjecting the switching material to a mass concentration gradient that drives the intercalating species between the switchable material and the intercalating species reservoir; e.g. by flowing gas over a surface of the switchable material. In some embodiments of the present disclosure, the first state of a switchable material may be transparent to radiation of at a least portion of the visible solar spectrum when intercalating species are intercalated into the switchable material, and while in the second state (tinted) the switchable material may absorb radiation of at least a portion of the visible solar spectrum when the intercalating species have been removed (decalated) from the switchable material and transported, for example, to an intercalating species reservoir.

Figure 1:
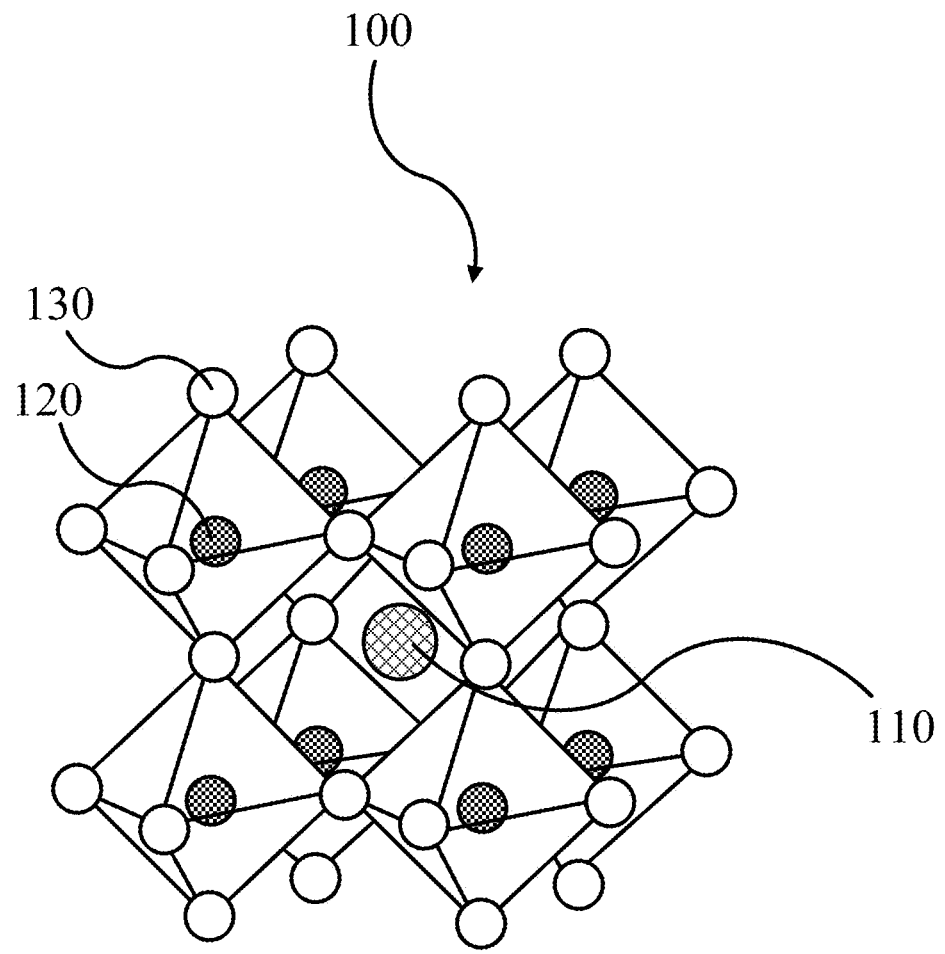
FIG. 1 illustrates an example of a perovskite, which may be used as a switchable material, according to some embodiments of the present disclosure.

In some embodiments of the present disclosure, the switchable material may be constructed of a perovskite. An example of a perovskite is an organic-inorganic metal halide perovskite, illustrated in FIG. 1. An organic-inorganic metal halide perovskite may organize into cubic crystalline structures, as well as other crystalline structures such as tetragonal and orthorhombic, and may be described by the general formula $ABX_3$, where X is an anion (130) and A and B are cations (110 and 120 respectively), typically of different sizes (A typically larger than B). In a cubic unit cell, the B-cation 120 resides at the eight corners of a cube, while the A-cation 110 is located at the center of the cube and with 12 X-anions centrally located between B-cations 120 along each edge of the unit cell. Typical inorganic perovskites include calcium titanium oxide (calcium titanate) minerals such as, for example, $CaTiO_3$ and $SrTiO_3$. In some embodiments of the present invention, the A-cation 110 may include a nitrogen-containing organic compound such as an alkyl ammonium compound. An A-cation 110 may include a metal and an anion 130 may include a halide.

Additional examples of an A-cation 110 include organic cations and/or inorganic cations. Depending on the number of organic groups, the cation may be a primary (1), secondary (2), tertiary (3), or quaternary (4) ammonium. The groups may be alkyl groups. Further examples of organic A-cations 110 include methylammonium ($CH_3NH_3^+$), ethylammonium ($CH_3CH_2NH_3^+$), propylammonium ($CH_3(CH_2)_2NH_3^+$), butylammonium ($CH_3(CH_2)_3NH_3^+$), and/or any other suitable nitrogen-containing organic compound. In other examples, an A-cation 110 may include an organic component with an amidinium group. For example, an A-cation 110 may be formamidinium ($NH_2CH=NH_3^+$) and/or acetamidinium (($NH_2C(CH_3)=NH_3^+$).

An A-cation 110 may include an organic constituent in combination with a nitrogen constituent. In some cases, the organic constituent may be an alkyl group such as straight-chain, or branched, hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), isopropyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and/or n-hexyl ($C_6$). Additional examples of alkyl groups include n-heptyl ($C_7$), n-octyl ($C_5$) and the like. The organic constituent may also be an aryl group. Aryl groups may include phenyl, naphthyl, benzyl, and/or their alkylated derivatives, for example, a xylyl group. An A-cation 110 may include halogenated counterparts to the hydrocarbon groups named above. For example, fluoromethyl, chloromethyl, bromomethyl, iodomethyl, fluorobenzyl, chlorobenzyl, bromobenzyl, and iodobenzyl groups. An A-cation 110 may be a metal. In some cases, the metal may be an alkali metal. Examples include cesium, rubidium, potassium, and/or sodium.

Examples of metal B-cations 120 include, for example, lead, tin, germanium, transition metals such as nickel, copper, or zinc, and/or any other 2+ valence state metal that can charge-balance the organic-inorganic metal halide perovskite 100. Examples of an anion 130 include halides: e.g. fluorine, chloride, bromide, iodide and/or astatide. In some cases, the organic-inorganic metal halide perovskite may include more than one anion 130, for example pairs of halides; chlorine and iodine, bromine and iodine, and/or any other suitable pairing of halides. In other cases, the organic-inorganic metal halide perovskite 100 may include two or more halides of fluorine, chlorine, bromine, iodine, and/or astatine.

Thus, an A-cation 110, a B-cation 120, and an anion 130 may be selected within the general formula of $ABX_3$ to produce a wide variety of organic-inorganic metal halide perovskite 100, including, for example, methylammonium lead triiodide ($CH_3NH_3PbI_3$), and mixed halogen perovskites such as $CH_3NH_3PbI_{3-x}Cl_x$ and $CH_3NH_3PbI_{3-x}Br_x$. Thus, an organic-inorganic metal halide perovskite 100 may have more than one halogen elements, where the various halogen elements are present in non-integer quantities; e.g. x is not equal to 1, 2, or 3. In addition, organic-inorganic metal halide perovskite, like other perovskites, can form three-dimensional (3-D), two-dimensional (2-D), one-dimensional (1-D) or zero-dimensional (0-D) networks, possessing the same unit structure.

Figure 2:
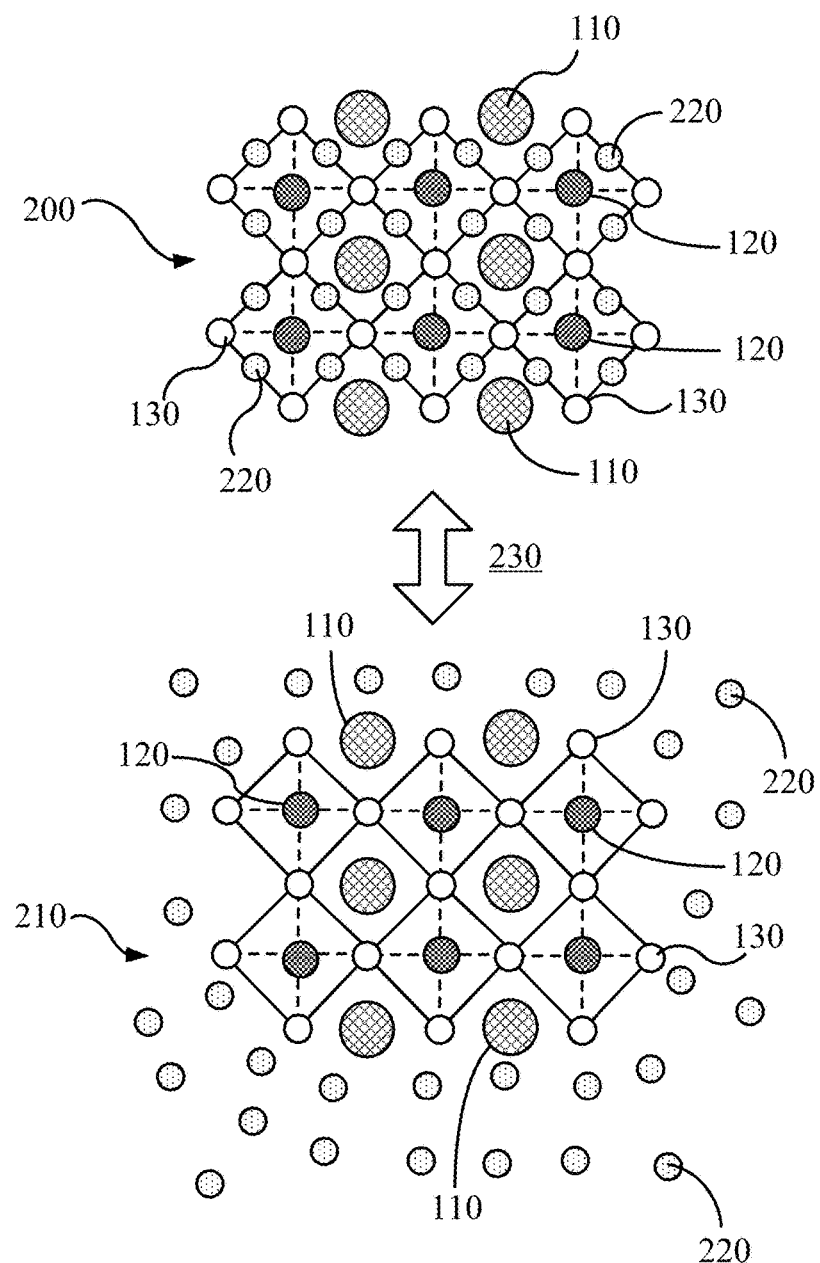
FIG. 2 illustrates a switchable material that is reversibly switchable between a first state that is transparent 200 and a second state 210 that is opaque, according to some embodiments of the present disclosure.

FIG. 2 illustrates a switchable material (e.g. a perovskite) that may be reversibly switched from the switchable material in a first state 200 to the switchable material in a second state 210, where the material is switched from the first state 200 to the second state 210 by a switching mechanism 230. In some embodiments of the present disclosure, the first state 200 of a switchable material may be characterized as being significantly transparent, whereas the second state 210 of the switchable material may be characterized as being significantly tinted, opaque, and/or reflective. The first state 200 of a switchable material may be characterized by the switchable material being substantially transparent to light, for example, light in the visible spectrum. The second state 200 of the switchable material may be characterized by the switchable material being substantially tinted, opaque, and/or reflective to light in the visible spectrum where the visible spectrum is between 390 nm to 700 nm for the human eye. In some embodiments of the present disclosure, a switchable material (200 and 210) may be reversibly opaque and transparent in any desired spectrum of light, as required by the specific application. For example, a switchable material (200 and 210) may be reversibly opaque and transparent in at least one of the ultraviolet, near infrared, mid infrared, and/or far infrared regions of the electromagnetic spectrum. It should also be understood that a transparent switchable material may approach 100% transmission of a portion of the electromagnetic spectrum when in the first transparent state 200. However, in some embodiments of the present disclosure, a transparent switchable material may transmit less than 100% of a portion of the electromagnetic spectrum when in the first transparent state 200. Similarly, in some embodiments of the present disclosure a tinted switchable material may approach 100% absorption of a portion of the electromagnetic spectrum when in the second tinted state 210. However, in some embodiments of the present disclosure, a tinted switchable material may absorb less than 100% of a portion of the electromagnetic spectrum when in the second tinted state 210.

As described above, a switching mechanism 230 may include a switch that reversibly changes the state of a switchable material from a tinted state 210 and a transparent state 200, for example, by exposing the switchable material (200 and/or 210) to, and/or shielding the switchable material from, a gradient. In some cases, a switching gradient may include at least one of a changeable pressure gradient, concentration gradient, temperature gradient, magnetic field gradient, and/or voltage gradient. In some embodiments of the present disclosure, a switching mechanism 230 may be a passive mechanism, for example, an ambient condition such as temperature, pressure, humidity, etc. Thus, when a predefined ambient condition is met, the switchable material may switch from a first transparent state 200 to a second tinted state 210 and vice versa. For example, a switching mechanism 230 may be defined by a target condition; when the switchable material is at or below the target condition, the switchable material may be in a first transparent state 200, and when the switchable material is above the target condition, the switchable material may be in a second tinted state 210. In some embodiments of the present disclosure, a switchable material (200 and/or 210) may be in a first transparent state when the switchable material is at or above a target condition and in a second tinted state when the switchable material is below the target condition. For example, a switchable material (200 and 210) may have a switching mechanism 230 that is a transition of at least one condition of the switchable material (200 and 210) from a first condition to a second condition, from a first range of conditions to a second range of conditions, and/or the transition of a condition through some target condition.

Thus, a switching mechanism 230 may be the transition of a temperature, a pressure, a humidity, a concentration, and/or a voltage of the switchable material (200 and 210) from a first condition to a second condition, from a first range of conditions to a second range of conditions, and/or a transition through some target condition. In some embodiments of the present disclosure, a switching mechanism 230 may be a transition of a bulk temperature and/or local temperature of the switchable material (200 and 210) through a target temperature between about 0° C. and about 50° C. In some embodiments of the present disclosure, a switching mechanism 230 may be a transition of a pressure of the switchable material (200 and 210) through a target pressure between about 0 torr and about 760 torr (gauge total pressure). In some embodiments of the present disclosure, a switching mechanism 230 may be a transition of a concentration of a gas that is in physical contact with a switchable material (200 and 210) through a target concentration. In some embodiments of the present disclosure, a switching mechanism 230 may be a transition of a voltage applied to a switchable material (200 and 210) through a target voltage. Thus, a switching mechanism 230 may be passively activated by the natural changes occurring to the environment in which the switchable material (200 and 210) is located, such that the switching mechanism 230 may be a passive change and/or transition of some condition of the switchable material (200 and 210). Or a switching mechanism 230 may be actively activated by a user inducing changes to the environment in which the switchable material (200 and 210) is located and/or to the switchable material (200 and 210). For example, a user may turn on a device that applies heat to a switchable material (200 and 210) such that a temperature of the switchable material (200 and 210) transitions through a temperature that results in the switchable material to switch from a first transparent state 200 to a second tinted state 210 and/or vice versa.

Referring again to FIG. 2, in some cases, a switching mechanism 230 may be a concentration gradient and may include manipulating a flow of mass (not shown) that is in contact with at least one surface of the switchable material (200 and 210) to affect the driving force of mass-transfer of the intercalating species 220 between the switchable material and flow of mass. A flow of mass may be, for example, a gas stream of an inert gas (e.g. argon, helium, etc.) A relatively low concentration of the intercalating species 220 in the gas stream may provide sufficient driving force for mass-transfer such that intercalating species 220 contained in the switchable material in the first state 200 decalate (e.g. are removed) from the switchable material and diffuse into the gas stream resulting in the switchable material switching from its first transparent state 200 to its second tinted state 210. Alternatively, a relatively high concentration of intercalating species 220 in the gas stream (not shown) may provide sufficient driving force for mass-transfer such that that intercalating species 220 contained in the gas stream diffuse from the gas stream and intercalate into the switchable material resulting in the switchable material switching from its second tinted state 210 to its first transparent state 200. For example, a flow of mass may be a liquid or gel stream (e.g. at least one of acetonitrile, ethylene carbonate, silicone, polyacrylamides, and/or any other suitable compound). A relatively low concentration of the intercalating species 220 in the gas stream may provide sufficient driving force for mass-transfer such that intercalating species 220 contained in the switchable material in the first state 200, decalate (e.g. are removed) from the switchable material and diffuse into the gas stream (not shown) resulting in the switchable material switching from its first transparent state 200 to its second tinted state 210. Alternatively, a relatively high concentration of the intercalating species 220 in the gas stream may provide sufficient driving force for mass-transfer, that intercalating species 220 contained in the gas stream diffuse from the gas stream and intercalate into the switchable material resulting in the switchable material switching from its second tinted state 210 to its first transparent state 200.

In some embodiments of the present disclosure, the switchable material may be switched from a first transparent state 200 to a second tinted state 210 by applying a pressure gradient. For example, a first transparent state 200 of a switchable material may be achieved by exposing the switchable material to a gas stream having a relatively high absolute pressure and/or partial pressure of intercalating species 220 contained within the gas stream such that the intercalating species 220 intercalate into the switchable material causing it to become transparent (first state 200). The switchable material in the first transparent state 200 may then be switched to the second tinted state 210 by a pressure gradient having a reduced absolute pressure in the gas stream (not shown) and/or by reducing the partial pressure of the intercalating species 220 contained within the gas stream, causing the intercalating species 220 to diffuse out of the switchable material into the gas stream.

In some embodiments of the present disclosure, the switchable material may be switched from a first transparent state 200 to a second tinted state 210 by applying a voltage gradient. For example, switching a switchable material from a first transparent state 200 to a second tinted state 210 may be achieved by exposing the switchable material to a thermal source, such that the thermal source transfers sufficient energy to the switchable material to cause a temperature increase in the switchable material, such that the higher temperature causes the removal of at least some of the intercalating species form the switchable material. The thermal source may cause the switchable material to reach a temperature of greater than about 0° C. for switching the switchable material from a first transparent state 200 to a second tinted state 210. In some embodiments of the present disclosure, a switchable material may reach a temperature between about 0° C. and about 100° C. to cause at least a portion of the intercalating species to diffuse out of the switchable material to cause the switchable material to switch from a first transparent state 200 to a second tinted state 210. In some embodiments of the present disclosure, a switchable material may reach a temperature between about 0° C. and about 50° C. to cause at least a portion of the intercalating species to diffuse out of the switchable material to cause the switchable material to switch from a first transparent state 200 to a second tinted state 210. Such a switching temperature may be a localized temperature and/or a bulk temperature of the switchable material.

A thermal source may include a hot plate, resistively heated transparent conductor, and/or any other suitable heating device that may transfer energy from the thermal source to the switchable material (200 and 210) by convective, conductive, and/or radiant heat-transfer. The heat source may be a light source. The light source may be the sun, a laser, an incandescent lamp, and/or an LED, etc. Removing or reducing the intensity of the light provided by a thermal source may switch the switchable material back from the second tinted state 200 to the first transparent stat 210. The thermal source may cause the switchable material to reach a temperature of less than about 50° C. to switch the switchable material from the tinted state 210 to the transparent state 200. In some embodiments of the present disclosure, a switchable material may reach a temperature of less than about 40° C. to cause at least a portion of the intercalating species to diffuse into the switchable material to cause the switchable material to switch from the second tinted state 210 to the first transparent state 200. In some embodiments of the present disclosure, a switchable material may reach a temperature between about 0° C. and about 30° C. to cause at least a portion of the intercalating species to diffuse into the switchable material to cause the switchable material to switch from the second tinted state 210 to the first transparent state 200. Such a temperature may be a localized temperature and/or a bulk temperature of the switchable material.

In some embodiments of the present disclosure, the switchable material (200 and 210) may be switched from a first transparent state 200 to a second tinted state 210 by applying a voltage gradient. For example, switching from a first transparent state 200 to a second tinted state 210 may be achieved by exposing the switchable material to a voltage source to decalate at least a portion of the intercalating species 220 form the switchable material to yield the second tinted state 210 of the switchable material. The voltage source may achieve a voltage of less than 10 V for switching the switchable material from a first transparent state 200 to a second tinted state 210. Removing, reducing the intensity, or reversing the polarity of the voltage source may switch the switchable material back from the second tinted state 210 to the first transparent state 200. The voltage source may achieve a voltage of less than 9 V for switching the switchable material from the second tinted state 210 to the first transparent state 200.

Examples of intercalating species 220 that may reversibly intercalate into and decalate from a switchable material (200 and 210) include neutral molecules, charged molecules, charged atoms, and/or any other suitable compound capable of reversibly intercalating into and out of the switchable material. In some embodiments of the present disclosure, intercalating species may be less than 1 nm in diameter. Neutral intercalating molecules may include at least one of $H_2O$, $NH_3$, $RNH_2$, $RR'NH$, $ROH$, hydrazine ($N_2H_2$), pyridine, a diamine, $SO_2$, $SO_3$, a hydrogen halide (e.g. HCl, HBr, HI), CO, and/or $CO_2$, where R and R' are organic functional groups. Charged intercalating molecules may include at least one of nitrite, isothiocyanate, cyanide, azide, hydrazinium, hydroxide, oxalate, alkylammoniums, amidiniums, and/or pyridinium. Charged intercalating atoms may include at least one of an iodide, a bromide, a chloride, a fluoride, a sulfide, and/or an oxide. Intercalating species may include any other atom, molecule, and/or compound capable of reversible mass-transfer into and out of the switchable material (200 and 210).

Referring again to FIG. 2, in some embodiments of the present disclosure, a switchable material (200 and 210) that may be switched from a first transparent state 200 to a second tinted state 210 may include methylammonium nickel iodide $(MA)_xNiI_y$, where MA=A, Ni=B, and I=X), hexylammonium nickel bromide $(HA)_xNiBr_y$ where HA=A, Ni=B, and Br=X), hexylammonium nickel iodide $(HA)_xNiI_y$, where HA=A, Ni=B, I=X, and $1 \leq x < 18$ and $3 \leq y < 6$), methyl ammonium lead iodide ($CH_3NH_3PbI_3$ where $CH_3NH_3$=A, Pb=B, and $I_3$=X), and/or a mixed cation/anion compound such as $FA_{0.9}Cs_{0.1}Pb_{0.5}Sn_{0.5}I_2Br$, where FA (formamidinium)=A, Cs=A, Pb=B, Sn=B, I=X, and Br=X. FIG. 2 illustrates that, for an example of a switchable material (200 and 210) constructed of a perovskite, while the switchable material is in a first transparent state 200, the intercalating species 220 may be arranged within the crystal structure of the perovskite. While in a first transparent state 200, at least some of the intercalating species 220 may be arranged between the anions 130 defining the corners of the octahedral clusters (unit structures) of the perovskite crystal structure and/or the intercalating species 220 may be positioned within the planes defining the octahedral clusters (unit structures) of the perovskite crystal structure. While in a perovskite switchable material is in its second transparent state 210, the intercalating species 220 may be substantially absent from the perovskite's crystal structure, having diffused out of the switchable material into the surrounding environment (e.g. an adjacent, neighboring, and/or bordering solid, liquid, and/or gas—a suitable intercalating species reservoir).

Figure 3:
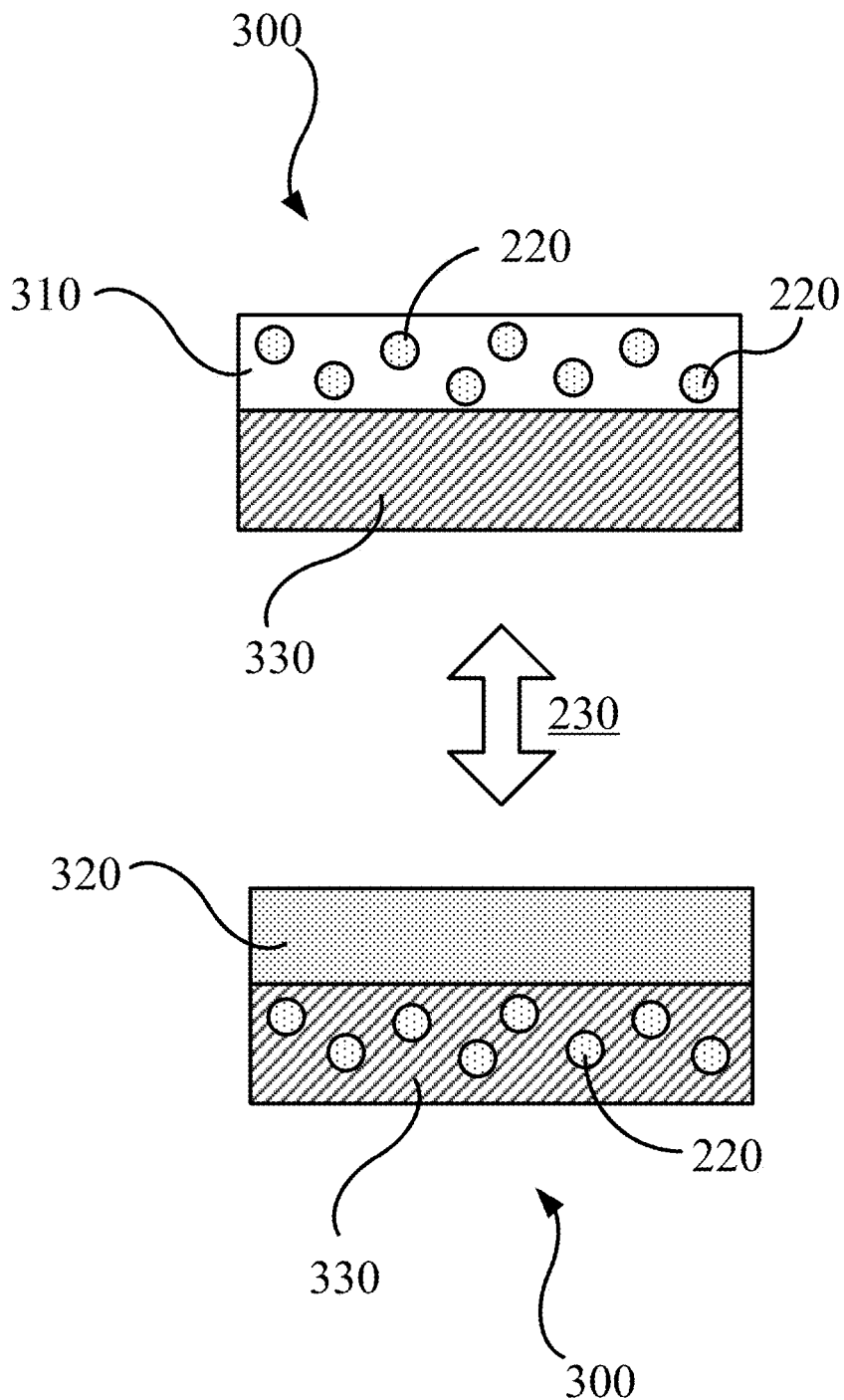
FIG. 3 illustrates a switchable layer that is reversibly switchable between a first state 310 that is transparent and a second state 320 that is opaque, according to some embodiments of the present disclosure.

Referring to FIG. 3, a switchable layer (310 and 320) may be in the form of a film and/or a layer that may be reversibly switched between a first transparent state 310 to a second tinted state 320, utilizing a switching mechanism 230 similar to those described above. Thus, FIG. 3 illustrates a switchable material that has been shaped into a specific shape or form, in this example, a film and/or layer. In some embodiments of the present disclosure, a switchable layer (310 and 320) may be in any other suitable shape and/or form; e.g. spheres, cylinders, rods, and/or cones, etc. In addition, a switchable layer (310 and 320) may have at least one textured surface. In the example of FIG. 3, the switchable layer (310 and 320) is shown positioned adjacent to an intercalating species reservoir 330. When the switchable layer is in a first transparent state 310, intercalating species 220 are intercalated into the switchable layer, as described above for switchable materials. As shown in the example of FIG. 3, while the switchable layer is in the first transparent state 310, none and/or a fraction of the intercalating species 220 may be contained in an intercalating species reservoir 330. When switched to the second tinted state 320, all or substantially all of the intercalating species 220 may diffuse out of the switchable layer into the intercalating species reservoir 330. However, it should be understood, that in some embodiments of the present disclosure, removal of intercalating species 220 from the switchable layer and/or the intercalating species reservoir 330 may be less than 100% complete; e.g. when the switchable layer is in a first transparent state 310, some intercalating species 220 may remain in the reservoir 330, and when in a second tinted state 320, some intercalating species 220 may remain in the switchable material.

In some embodiments of the present disclosure, as described above, an intercalating species reservoir 330 may be a space positioned adjacent to the switchable layer (310 and 320) such that the space is filled with at least one of a gas, a liquid, and/or a solid. When an intercalating species reservoir 330 includes a space filled with a gas, the space may be at any suitable pressure, from pressures above atmospheric pressure (e.g. about 760 torr up to 1550 torr) to pressures equal to or approaching absolute vacuum (e.g. about $10^{-11}$ up to 760 torr). In some embodiments of the present disclosure, a gas may be contained in an intercalating species reservoir 330 (e.g. a space) that is completely enclosed and isolated from the environment external to the device 300, with no inlet and/or outlet to allow for the transfer of gas and/or intercalating species 330 between the intercalating species reservoir 330 and an environment external to the device 300. In some embodiments of the present disclosure (see FIG. 4), at least one port 430 may be positioned within the intercalating species reservoir 330 such that the intercalating species 220 may be reversibly added and/or removed from the intercalating species reservoir 330. In some embodiments of the present disclosure, an intercalating species reservoir 330 in the form of an empty space may be positioned relative to the switchable layer (310 and 320) such that there are no physical barriers to mass-transfer between the space and the switchable layer (310 and 320).

Figure 4:
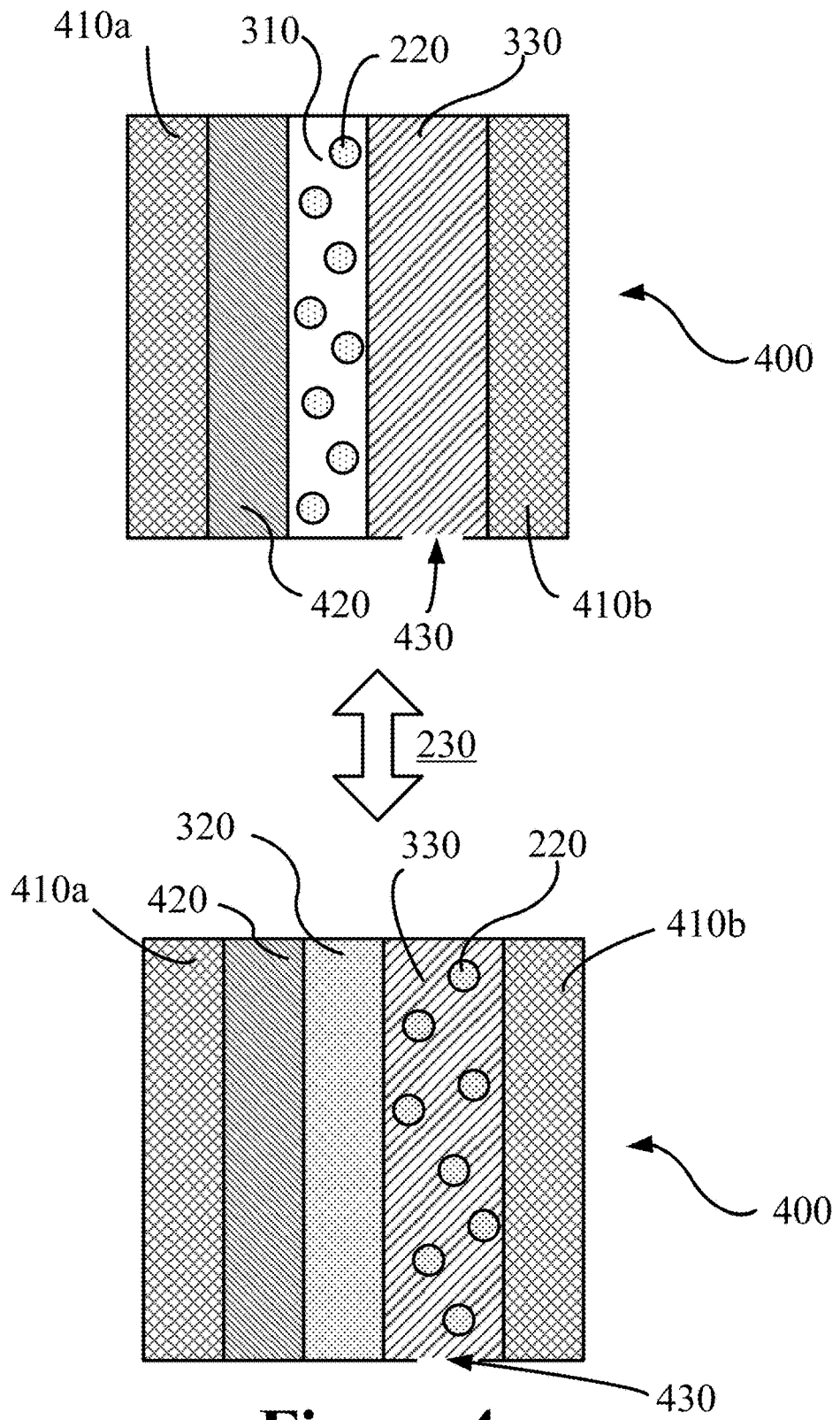
FIG. 4 illustrates a device, for example a thermochromic window that includes a switchable layer that is reversibly switchable between a first state 310 that is transparent and a second state 320 that is opaque, according to some embodiments of the present disclosure.

Referring to FIG. 4, a gas positioned within an intercalating species reservoir 330 (e.g. an empty space) may be reversibly removed from an intercalating species reservoir 330 by connecting a conduit (not shown) to a port 430 positioned within a wall/boundary of the intercalating species reservoir 330 such that a vacuum may be applied to the intercalating species reservoir 330 (e.g. by a vacuum pump). The vacuum applied to the intercalating species reservoir 330 may provide a driving force that reversibly removes at least a portion of the intercalating species 220 positioned within the switchable layer, thereby switching the switchable layer from a first transparent state 310 to a second tinted state 320. Reapplication of the original pressure, or removal of the vacuum applied to the intercalating species reservoir 330, may subsequently result in the re-intercalation of the intercalating species 220 into the switchable layer, returning the switchable layer of the device 400 to its first transparent state 310.

FIG. 4 further illustrates that a device 400 incorporating a switchable layer (310 and 320) may include additional features including at least one of a first substrate layer 410$a$, a second substrate layer 410$b$, and/or an intervening layer 420. For the example where the device 400 is a window or window application, a substrate layer (410$a$ and/or 410$b$) may be a solid and transparent substrate layer such as glass and/or a transparent conducting material (e.g. a transparent conducting oxide (TCO)). A TCO layer may carry electrical current to/from the switchable material layer when the switchable material is in the second tinted state 310. Such a TCO layer may be porous, dense, and/or patterned and may include but is not limited to: metal, doped metal oxides, and/or carbon-based materials such as graphite, carbon nanotubes, and/or graphene. A substrate layer (410$a$ and/or 410$b$) may provide a physical foundation upon which to construct at least some of the other elements of the device 400 such as the switchable layer (310 and 320). A TCO layer may provide electrical carrier (electron or hole) transport from the switchable layer (310 and 320). In general, a substrate layer 410 may be constructed of a high-transmission material such as glass or flexible polymer that may also be used to encapsulate at least some of the layers described herein. A substrate layer may also include a low emissivity (low-c) coating to regulate the amount of ultraviolet and infrared solar radiation from passing through the substrate layer. An additional carrier transport layer may block the transport of one carrier and facilitate the transport of the other.

In some embodiments of the present disclosure, an intervening layer 420 may be substantially transparent and may provide the function of a switching mechanism 230, for example, by acting as switchable heating source (e.g. a resistive heating element that may be actively turned on and off by a user). In some embodiments, an intervening layer 420 may be substantially transparent and may provide the function of a switching mechanism 230, for example, by acting as switchable electrical current, voltage and/or magnetic biasing source. Thus, an intervening layer 420 may provide an active switching mechanism 230 so that a user may actively and reversibly switch a switchable layer between a first transparent state 310 to a second tinted state 320.

Figure 5:
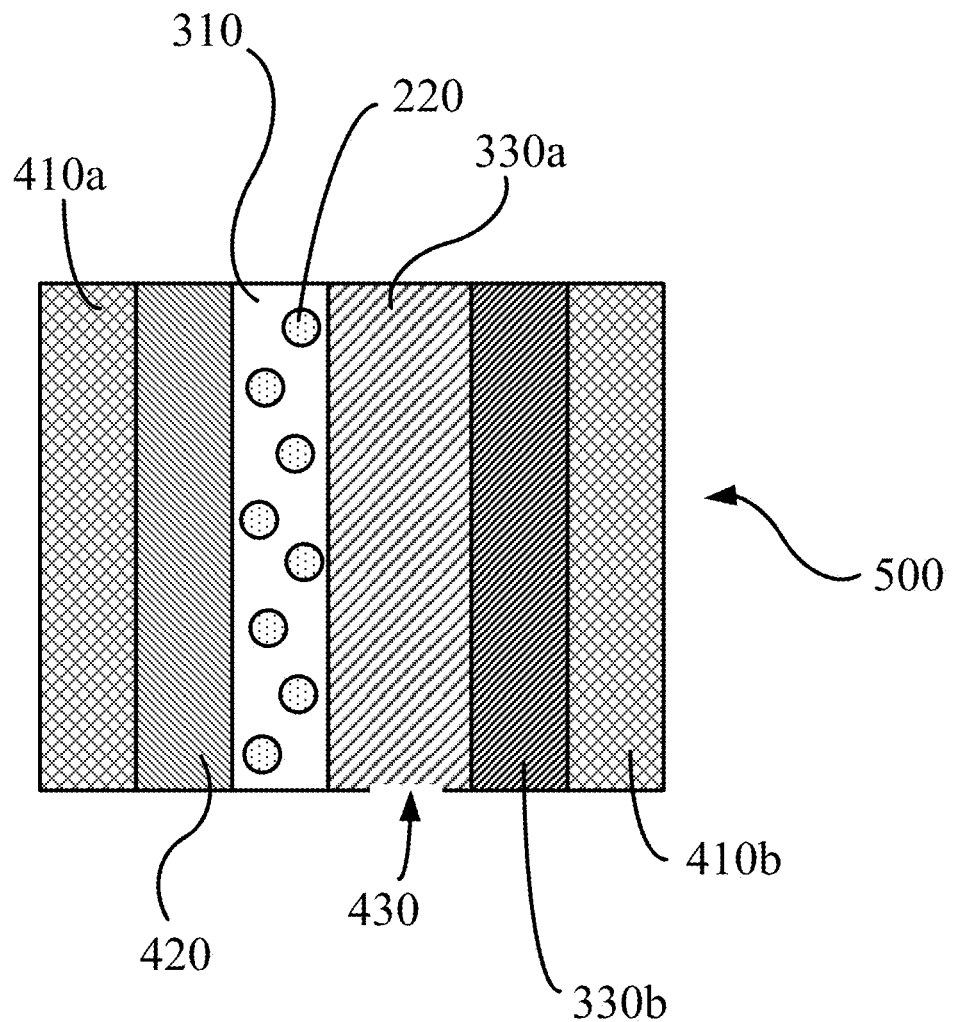
FIG. 5 illustrates a device, for example a thermochromic window that includes a switchable layer that is reversibly switchable between a first state that is transparent and a second state that is opaque, according to some embodiments of the present disclosure. (Only the first state 310 of the switchable layer is shown.)

FIG. 5 illustrates that some embodiments of the present disclosure may relate to a device 500 containing a switchable layer (only the first transparent state 310 is shown; e.g. with intercalating species 220 intercalated into the switchable layer) having more than one intercalating species reservoirs. In this example, the device 500 includes a second intercalating species reservoir 330$b$ with a first intercalating reservoir 33$a$ positioned between the second intercalating species reservoir 330$b$ and the switchable layer 310. The point of FIG. 5 is that, although the figures provided herewith illustrate examples of devices having specific types of layers, numbers of layers, in specific arrangements, the specific types of layers, number of layers, and arrangements will be determined by each individual device's design requirements. All of these potential arrangements are intended to fall within the scope of the present disclosure.

Figure 6:
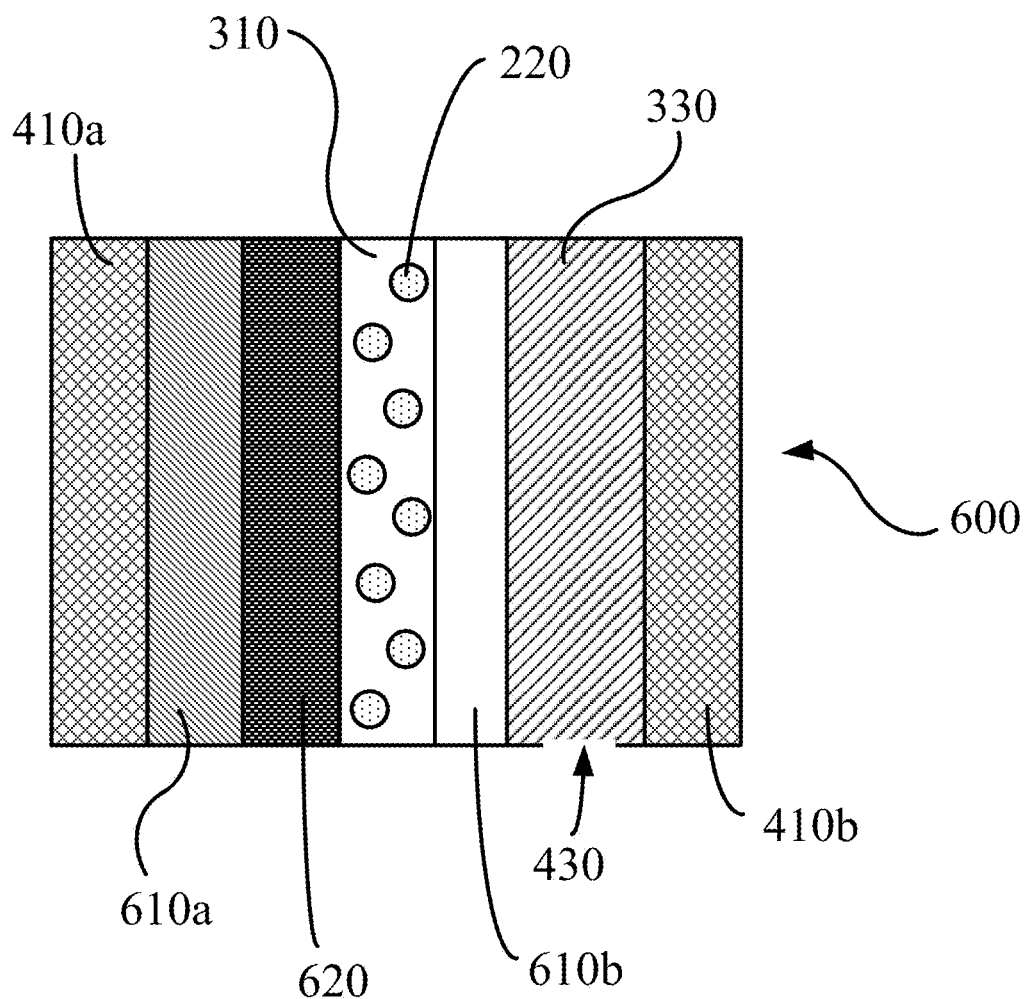
FIG. 6 illustrates a device, for example a photovoltaic thermochromic window that includes a switchable layer that is reversibly switchable between a first state that is transparent and a second state that is opaque, according to some embodiments of the present disclosure. (Only the first state 310 of the switchable layer is shown.)

FIG. 6 illustrates a device 600 that includes a switchable layer (only the first transparent state 310 is shown; e.g. with intercalating species 220 intercalated into the switchable layer) such that the device may perform as switchable window or window application that may reversibly switch from a transparent state 310 to a tinted state (not shown). In addition, the device 600 contains at least some elements that enable the device 600 to function as a photovoltaic device capable of generating power when exposed to light (not shown). Thus, in some embodiments of the present disclosure, a device 600 may include at least one of a first conductor 610$a$ (e.g. fluorine-doped tin oxide, a second conductor 610$b$ (e.g. PEDOT:PSS), and/or one or more carrier transport layers 620 (e.g. titanium oxide, tin oxide, molybdenum oxide, phenyl-C61-butyric acid methyl ester (PCBM) and/or SPIRO). In some embodiments of the present disclosure, a carrier transport layer 620 may be an electron transport layer (ETL), where the ETL may be an optional transparent layer that may be used to extract photogenerated electrons and block hole transport from the switchable material and/or layer. ETL materials that may be used in some embodiments of the present disclosure are low-work function inorganic oxides such as doped $TiO_2$, $SnO_x$, and/or ZnO as well as organics—polymers, fullerenes, and/or derivatives such as Phenyl-C61-butyric acid methyl ester (PCBM). In some embodiments of the present disclosure, a carrier transport layer 620 may be a hole transport layer (HTL), where the HTL may be an optional transparent layer used to extract photogenerated holes and block electron transport from the switchable material and/or layer. HTL materials that may be used in some embodiments of the present disclosure are inorganic semiconductors such as copper iodide and copper thiocyanate. HTL materials may also include organic conductors such as poly(3-hexylthiophene-2,5-diyl) (P3HT), octakis(4-methoxyphenyl)-9,9-spirobi[9H-fluorene]-2,2,7,7-tetramine (SPIRO-MeOTAD), and/or poly(3,4-ethylenedioythiophene):poly(styrenesulfonate) (PEDOT:PSS). Nanomaterials such as carbon nanotubes, graphene, and quantum dots may also be used to construct an HTL.

In some embodiments of the present disclosure, a device containing a switchable material that may be switched between a first transparent state to a second tinted state using a switchable hydrophobicity layer (not shown). A switchable hydrophobicity layer may be transparent while the device is in the transparent state. It may serve as a solid-state alternative to a gas space as an adjacent layer for intercalating species to transfer to. The switchable hydrophobicity layer may be switched from hydrophobic to hydrophilic in order to transfer intercalating species from the switchable optical and/or absorber layer. The intercalating species transfer from the optical or absorber layer when in the hydrophilic state, and return to the switchable hydrophobicity layer after being switched to the hydrophobic state.

A switchable hydrophobicity layer may be provided by a number of materials in response to stimuli such as pH, solvent, temperature, light, and/or electrical bias. These materials may be semiconductor oxides such as $WO_3$, $TiO_2$, ZnO, $SnO_2$, $V_2O_5$, and/or $Ga_2O_3$, which may reversibly switch between superhydrophilic and superhydrophobic by switching their surface chemical environment between oxygen vacancies and hydroxyl groups and/or due to oxidation/reduction of the material using light irradiation, electric fields, and/or temperature gradients. A switchable hydrophobicity layer may also be organic. These may include transparent "thermoresponsive" materials that are hydrophobic at room temperature and hydrophilic at elevated temperature, including polymers such as poly(N-isopropylacrylamide) (PNIPAAm), poly(e-caprolactone), as well as carbon-based materials such as graphene and/or nanotubes. Other materials that may provide suitable hydrophobicity layers include UV/visible-responsive polymers that switch from superhydrophobic to superhydrophilic upon irradiation; e.g. include poly(HFBMA-r-BIEM-graft-SPMA), azobenzene, spiropyran, and/or their derivatives. An electric field may also reversibly switch films from hydrophobic to hydrophilic. Electro-responsive self-assembled monolayers and polymers such as polythiophene films and microstructured polypyrrole, among others, may be used. "Hydrophobic gating" resulting from the application of a bias across a nanoporous polyethylene terephthalate (PET) film and/or carbon nanotube paper may also be utilized. Electrochemical reduction/oxidation is another effective switching method in materials such as PEDOT, polyaniline, and/or polypyrrole. Layers of nanoparticles may be used in a switchable hydrophobicity layer. A reversible hydrophobicity change may result by the oxidation/reduction of the nanoparticle, and/or the ligands at the nanoparticle surface may be switched to tune the hydrophobic/hydrophilic properties. These nanoparticles may be composed on materials that absorb in the infrared to prevent the thermal energy gain of infrared light missed by the bandgap of the photovoltaic absorber.

Figure 7:
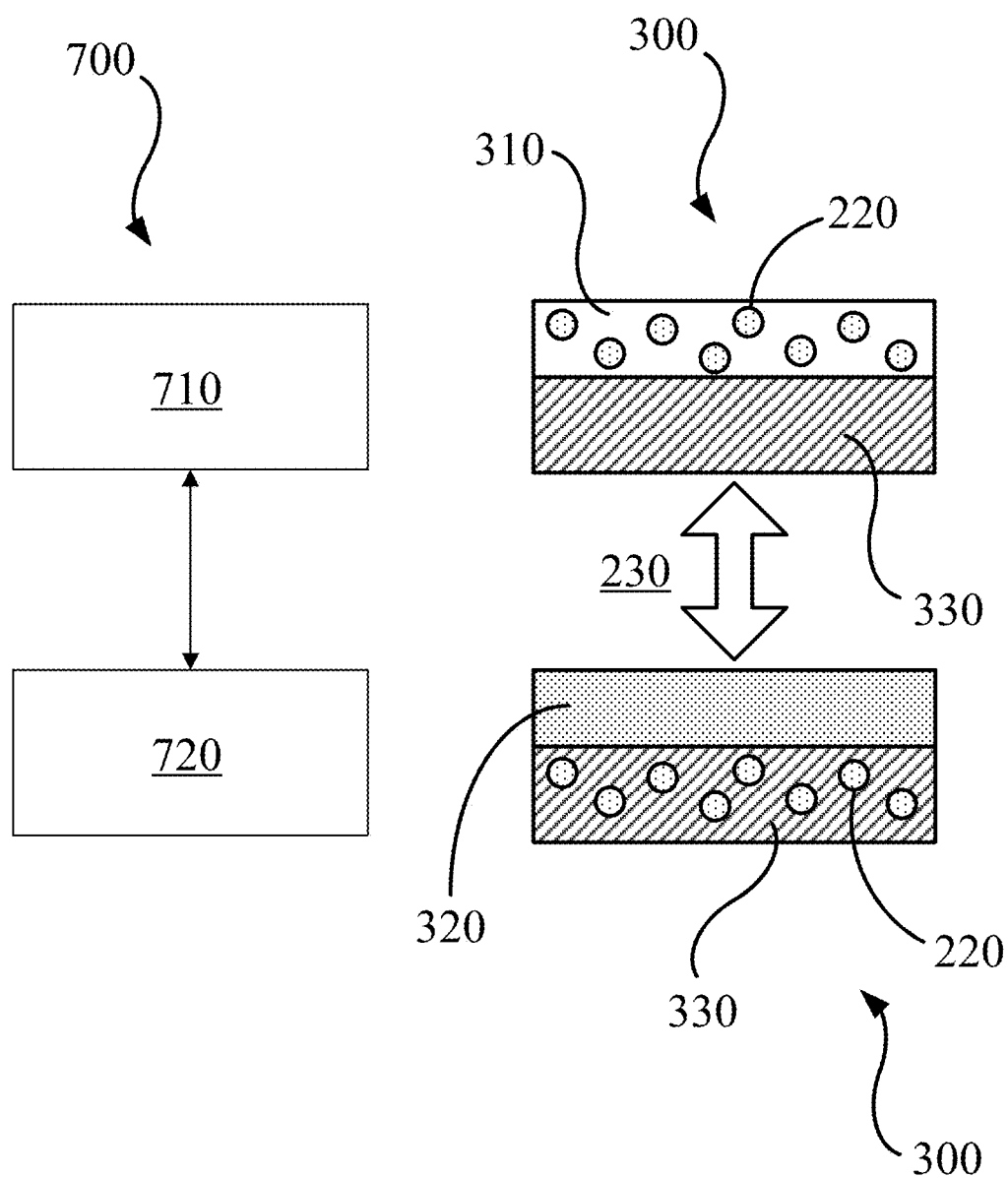
FIG. 7 illustrates a method for reversibly switching a switchable material between a first transparent state 310 to a second opaque state 320, according to some embodiments of the present disclosure.

FIG. 7 illustrates a block flow diagram summarizing a method 700 for reversibly switching a device 300 having a switchable layer in a first transparent state 310 to a second tinted state 320 using a switching mechanism 230. The method 700 may include applying a first condition 710 to at least one element of the device (e.g. the switchable layer), such that the first condition 710 maintains the intercalation of the intercalating species 220 within the switchable layer, such that the switchable layer maintains the first transparent state 310. In addition, the method 700 may include applying a second condition 720 to at least one element of the device (e.g. the switchable layer), such that the second condition 720 causes the removal of at least a portion off the intercalating species 220 from the switchable layer such that the switchable layer switches from the first transparent state 310 to the second tinted state 320. As described above, the first condition and/or the second condition may include manipulating the physical conditions of at least one element of the device 300, including temperatures, pressures, oxidations states, concentrations, and/or flow rates, etc.

Some advantages that may be provided by some of the embodiments described herein include:

1) Switchable layers may be processed from solution for scalable solution processing that may be easily incorporated into current window manufacturing. The layers may be sprayed and used to retrofit existing windows to improve energy efficiency.

2) The use of temperature to switch the switchable layers reversibly between a first state and a second state is not fixed and may be tuned to be appropriate for any climate.

3) The color of the tinted state may be tuned for an array of aesthetic visible colors and into the infrared. Infrared (IR) absorption is very important for energy-savings to the consumer. Some embodiments disclosed herein show switchable absorption in the near infrared (black coating), the visible spectrum of light (green and red), and in the IR.

4) Molecular intercalation chromogenics is characterized by fast transparent-to-tinted switching times due to the small size and high mobility of the intercalating species. Switching can include time scales as short as 1 microsecond and as long as 30 minutes.

5) The tinted state of some of the devices described herein may include photovoltaic elements that are shown herein to harness solar radiation and convert it to electricity.

Example 1

This example demonstrates a molecular intercalation mechanism using a nickel halide-based hybrid organic-inorganic perovskite layer as a switchable layer. The nickel halide-based hybrid organic-inorganic switchable layer was first hydrated (e.g. using water as the intercalating species) and then reversibly switched by transferring the water as a vapor from the switchable layer to a neighboring gas phase, thus switching the switchable layer reversibly from the transparent state (layer having intercalated water) to the tinted state (water substantially removed from the perovskite layer).

To produce the nickel halide-based hybrid organic-inorganic layers, methylammonium iodide, $CH_3NH_3I$ (MAI), was first synthesized by reacting 27.86 ml $CH_3NH_2$ (33% in ethanol) and 30 ml HI (57 wt. % in water, Aldrich in a 250 ml round-bottom flask at 0° C. for about 4 hours with stirring. The precipitate was recovered by evaporation at 55° C. for about 1 hour in a rotovap. MAI was dissolved in ethanol, recrystallized from diethyl ether, and dried at 60° C. in a vacuum oven for about 24 hours. Hexylammonium iodide (HAI) and hexylammonium bromide (HABr) were produced using the same procedure and molar ratios as MAI. 1 M precursor solutions were prepared by adding $NiI_2$ (Aldrich) and MAI to water. $MANiI_y$ layers were produced by depositing the 1 M precursor solution composed of MAI and $NiI_2$ in water onto a UV-ozone-treated (5 min) glass substrate layer and spinning at 1000 rpm for 15 seconds.

FIG. 8 illustrates the thermochromic behavior of the resultant switchable $MANiI_y$ layer. The as-deposited switchable layer appears in a first transparent state 310, corresponding to the first state of the switchable material. The layer was optically transparent until it was heated on a hot plate to about 50° C., which actively switched the layer to the second tinted state 320, corresponding to the second state of the switchable material. This effect was reversible, as the $MANiI_y$ layer quickly (~60 s) returned to the transparent state after removal of the device from the hotplate and placement of the device onto a room temperature surface.

Water intercalation was the source of the color change in the switchable layer. This was demonstrated by drop-casting the precursor solution onto an attenuated total reflectance (ATR) crystal and sealing the resulting layer in a glass chamber. The resultant spectra are shown in FIG. 9. The initial spectrum (solid line) clearly shows a significant resonance due to the O—H stretching modes of water at ~3200 $cm^{-1}$. As dry $N_2$ was passed over the layer, the intercalating water was transferred to the gas phase and can be observed as the O—H modes gradually disappear with time (dashed lines). The data also show that the same result obtained by thermally annealing the switchable layer may be obtain by flowing dry nitrogen gas over the switchable layer, which means the intercalating water was successfully removed from the switchable layer both by temperature means and by providing a concentration gradient to drive mass-transfer (e.g. in the absence of application of a thermal gradient). In addition, the transparent hydrated switchable layer ($MANiI_y.zH_2O$) absorbed in the IR region of the solar spectrum and may thus serve as a functional component of a glazing device by decreasing IR transmission from an external environment through the switchable device.

FIGS. 10, 11, and 12 demonstrate the color tunablility of Ni halide-based switchable perovskite layers. Switching MAI for HAI or HABr changes the absorption properties of the layer. A switchable layer cast from a 1 M water solution of HABr and $NiBr_2$ is shown in FIG. 10. This layer was optically transparent when it is cast (not shown). Placement of the switchable layer's glass substrate layer on 50° C. hotplate, resulted in the switchable layer changing to green second state 320 after a few seconds. The same phenomenon was observed for layers cast from HAI and $NiI_2$, which yielded a red layer second state 320 after annealing to 50° C. on a hotplate (see FIG. 11). Both layers reversibly switched back to transparent when removed from the hotplate and placed on a room temperature surface. The absorption spectra of the two films shown in FIGS. 10 and 11 are shown in FIG. 12. Switching the halide (I for Br) clearly shifts the excitonic absorption from 876 nm to 718 nm. The absorption peak observed at 1600 nm is residual water.

This example illustrates distinct advantages relative to current thermochromic technology. Firstly, the switchable film was cast from aqueous solution. Water is avoided in the processing of current commercialized thermochromic window technology based on ligand exchange. Moreover, the switchable layers that were applied were composed of non-toxic, abundant elements that are color-tunable. The layers were cast from solution, which can be easily scaled and incorporated into existing window manufacturing technology or used to retrofit existing windows. The molecular intercalation mechanism also facilitates fast switching. Films were switched to the tinted state within seconds of increasing the layer temperature, and it was switched to the transparent state in minutes.

Example 2

This example expands the molecule intercalation mechanism to photovoltaic layers based on hybrid organic-inorganic perovskites, such as $CH_3NH_3PbI_3$. In this example, perovskite layers are implemented in smart window technology using passive switching of a switchable optical $CH_3NH_3PbI_3$ layer actuated by simulated solar irradiation, as well as active switching of a $CH_3NH_3PbI_3$-based photovoltaic device. Additionally, it is show herein that this actively switched photovoltaic device will operate after "color cycling" the optical $CH_3NH_3PbI_3$ layer.

To produce $CH_3NH_3PbI_3$ layers, methylammonium iodide, $CH_3NH_3I$ (MAI), was first synthesized by reacting 27.86 ml $CH_3NH_2$ (33% in ethanol) and 30 ml HI (57 wt. % in water, Aldrich in a 250 ml round-bottom flask at 0° C. for about 4 hours with stirring. The precipitate was recovered by evaporation at 55° C. for 1 hour in a rotovap. MAI was dissolved in ethanol, recrystallized from diethyl ether, and dried at 60° C. in a vacuum oven for 24 hours. A 0.8 M solution of MAI and $PbI_2$ (Aldrich) in gamma-butyralactone (GBL) and dimethylsulfoxide (DMSO) (7:3 v/v) was prepared by stirring at 60° C. for 12 hours. The resulting solution was coated onto a glass substrate layer treated in UV ozone cleaner by spin-coating process at 1,000 and 20 seconds. During the spin-coating step, the substrate layer (around 1 in ×1 in) was treated with toluene drop-casting to remove excess GBL and DMSO.

The solid curve in FIG. 13 is the absorption spectrum of the resulting film $CH_3NH_3PbI_3$, which has a sharp absorption onset at ~800 nm. The layer was switched to the transparent state by placing the film in a glass cuvette sealed with a gas-tight septum, evacuating the cuvette to ~50 mTorr pressure, and injecting 20 mTorr $CH_3NH_2$ (the intercalating species). The $CH_3NH_2$ was injected by opening a valve to an enclosed flask containing 100 mL solution of $CH_3NH_2$ (33% in ethanol) and drawing the vapor from the headspace of the flask. The $CH_3NH_3PbI_3$ layer switched to transparent immediately (<1 second) after the partial pressure of $CH_3NH_2$ of 20 mTorr was reached. The absorption spectrum of the transparent intercalated optical layer ($MAIPbI_3.xNH_3$) is shown as the dashed line in FIG. 13.

Passive switching of the $CH_3NH_3PbI_3$ layer was also demonstrated. The $CH_3NH_3PbI_3$ layer on glass was placed into a custom-built chamber and evacuated to (~50 mTorr). The $CH_3NH_3PbI_3$ layer was switched by injecting $CH_3NH_2$ using the same method described in the previous experiment. The layer was then irradiated with a xenon lamp. Switching from the transparent state to the tinted state was immediately observed (<1 s) in the region of the film that was irradiated, which can be seen in the photographs shown in FIG. 14. This is a thermochromic effect, as the increase in temperature caused the intercalated species in the circular irradiated region of the layer to transfer from the switchable perovskite layer to the adjacent gas space (the intercalating species reservoir). The process was reversed over the course of about 15 minutes as the $CH_3NH_3PbI_3$ layer and glass substrate layer cooled and returned to the transparent state by intercalation of the $CH_3NH_2$ molecules into the $CH_3NH_3PbI_3$ layer.

Optical switching may be achieved even when the $CH_3NH_3PbI_3$ is incorporated as an absorber layer in a photovoltaic (PV) device. An example device design is illustrated in FIG. 15. The PV device 1500 was fabricated using the following procedure: A layer of mesoporous $TiO_2$ 1510 (~300 nm) was spin-coated on c-$TiO_2$/fluorine-doped tin oxide (FTO) layer 1520 from ethanol diluted $TiO_2$ paste, followed by 30 minutes of about 450° C. annealing. The FTO layer was formed on a glass substrate layer 1530. $CH_3NH_3PbI_3$ precursor was made of 1.4 M equimolar mixture of MAI and $PbI_2$ in gamma-butyrolactone (GBL)/ dimethyl sulfoxide (DMSO) (7/3 v/v). The substrate layer was spun at 4500 rpm for 50 seconds, and toluene was dispersed as an anti-solvent during the spinning. The resulting film was further annealed at 85° C. for 10 minutes. Finally, 100 nm of gold was deposited as a counter electrode (1540a and 1540b) to complete the device.

The PV device 1500 of FIG. 15 was "color cycled" between tinted and transparent states following fabrication as shown in FIG. 16. This was achieved by injecting $CH_3NH_2$ vapor into the evacuated chamber to change the switchable layer from the first opaque state 320 to the transparent state 310 as described above. The $CH_3NH_2$ vapor was then removed by flowing $N_2$ through the chamber and out through an HCl bubbler to remove excess $CH_3NH_2$ from the PV device 1500. The film was then "regenerated" by irradiating the film with a xenon lamp to increase the temperature of the PV device 1500 and transfer the $CH_3NH_2$ back into a gas space 1550 neighboring the PV device 1500, resulting in a return in the device 1500 to opaque state 320. This process was captured in a series of photographs illustrated in FIG. 16. Current density-voltage (J-V) characteristics of the device before cycling (see FIG. 17) and after two tinted/transparent cycles (see FIG. 18) demonstrate the device was able to cycle states without losing its functionality. The open circuit voltage was reduced by more than half its original value, but the short circuit current actually increased by nearly 2 mA cm$^{-2}$.

This example demonstrates an optical layer that was processed from solution and switched at speeds exceeding existing chromogenic technology by employing the molecular intercalation mechanism described herein. In this case, $CH_3NH_2$ as intercalating molecules, were transferred to and from a switchable $CH_3NH_3PbI_3$ layer to a gas space (intercalating species reservoir) to optically change the switchable layer from a first transparent state to a second tinted state. It is shown herein that the switchable optical layer may be passively switched using a thermochromic mechanism by heating the switchable layer with simulated solar radiation and also, that the switchable layer may be actively switched by pumping gas into a gas space layer. Finally, it was demonstrated that the switchable layer remained photovoltaically active even after color cycling the $CH_3NH_3PbI_3$-based PV device. FIGS. 17 and 18 show the current-voltage characteristics of the device before (FIG. 17) and after (FIG. 18) two cycles of switching the photovoltaic layer from tinted to transparent.

Example 3

A hermetically-sealed, scaled switchable device was fabricated to demonstrate thermochromic switching of a switchable layer. A 2.5-inch by 2.5-inch glass was washed by sonication in acetone and isopropyl alcohol (~10 min each). The substrate layer was treated with UV—$O_3$ for 15 minutes. The switchable optical absorber layer was deposited on this substrate layer from solution. A 1.2 M solution was formed by combining 206.3 mg formamidinium iodide (FAI), 608.5 mg lead iodide ($PbI_2$), 26.9 mg methylamonnium bromide (MABr), and 88.1 mg lead bromide ($PbBr_2$) in a glass vial. 0.8 mL and 0.2 mL of anhydrous diethylformamide and anhydrous dimethyl sulfoxide (DMSO) were added to the salt precursors, respectively. The Molar ratios of the salts were 1 FAI: 1.1 $PbI_2$: 0.2 MABr: 0.2 $PbBr_2$. The salts were dissolved by vortexing for 5 to 10 minutes. Finally, 40 μL of 1.5 M cesium iodide solution was added.

The solution was spin-coated in a $N_2$ glovebox by coating the substrate layer and spinning at 1000 rpm for 10 seconds then 5000 rpm for 30 seconds. 0.5 mL of chlorobenzene was dripped over the course of approximately 1 seconds when 12 seconds remained in the spin cycle. The film was annealed for 1 hour in $N_2$ a glovebox at 100° C. The film converted to a tinted (brown/black) phase in approximately 60 seconds. About 3 cm of the outside edge of the layer was removed mechanically by scraping it off with a stainless-steel razor blade. The edge was cleaned with a Kim Wipe soaked in DMSO.

The switchable optical absorber layer deposited on glass was encapsulated with an additional, cleaned 2.5-inch by 2.5-inch piece of glass sealed with polyisobutylene (PM). Strips of PIB were positioned around the edges of the clean piece of glass. 2 mm steel spacers were placed at two corners, and a 1.5 mm (outer diameter) glass capillary was placed at a third corner. Another layer of PIB strips was positioned around the edges of the glass, and the assembly was heated to 120° C. on a hotplate in a $N_2$-purged glovebox for 5 minutes to reduce the viscosity of the PIB and allow it to flow. The glass substrate layer with the switchable optical absorber layer was then placed on alignment with the glass/PIB substrate layer with the switchable optical layer facing downward. The entire assembly was then mechanically pressed to seal around the edges of the glass, leaving only the capillary to expose the internal volume to the outside atmosphere.

Vacuum was pulled (approximately 10$^{-3}$ Torr) through the capillary to remove the atmosphere between the PM-sealed glass substrate layers. 28 Torr of $CH_3NH_2$ was introduced through the capillary followed by $N_2$. This atmosphere was hermetically sealed within the glass/PM/glass assembly by using a butane torch to cut and flame-seal the capillary. Photographs of the completed device are shown in FIG. 19 (labeled a-d).

The optical layer was switched from transparent to tinted by illuminating the device with 150 W incandescent light bulb from a distance of 5.5 cm for 10 minutes. The device was removed from illumination, and optical images were taken in conjunction with infrared (IR) images as a function of time for over 8 minutes. FIG. 19 shows the IR images (lower row) corresponding to the photographic images (top row) for select snapshots in time. The device was 81° C. after being removed from illumination for about 30 seconds, and the switchable optical film remained in the tinted state. The temperature decreased to 33° C. over the course of about 450 seconds as shown in FIG. 20. At this point, the switchable optical layer returned to the transparent state. This example indicates a switching temperature of approximately 35° C. for a partial pressure of $CH_3NH_2$ of 28 torr.

Example 4

A full photovoltaic device was fabricated that was visibly transparent when a switchable optical absorber layer was in a transparent state 200 by employing doped octakis(4-methoxyphenyl)-9,9-spirobi[9H-fluorene]-2,2,7,7-tetramine (SPIRO-MeOTAD) and poly(3,4-ethylenedioythiophene):poly(styrenesulfonate) (PEDOT:PSS) as a hole transport 2200 layer and a transparent conductor layer 2100, respectively. The complete PV device 2000 is shown in FIG. 21 (only the transparent state 310 of the device is shown).

A 1-inch by 1-inch glass layer 2500 with patterned fluorine-doped tin oxide (FTO) layer 2400 was washed by sonication in acetone and isopropyl alcohol (~10 minutes each). The FTO layer 2400 was treated with UV—$O_3$ for 15 minutes. A solution of 0.15 M TAA in 1-butanol (TAA=titanium diisopropoxide bis(acetylacetonate, 75 wt % in IPA, concentration of approximately 2 M) was spin-coated onto the with the following procedure: 700 rpm, 10 seconds; 1000 rpm, 10 seconds; 2000 rpm, 30 seconds. Excess TAA was washed off of the device contact areas using ethanol, and residual solvent was removed from the film by heating it on a hot plate at 125° C. for 2 or more minutes. The TAA film was finally annealed at 500° C. for one hour to produce a $TiO_2$ layer 2300.

The switchable optical absorber layer (shown only in the transparent state 200 in FIG. 21) was also processed from solution. The solution included a 1.2 M solution composed of 206.364 mg formamidinium iodide (FAI), 608.5 mg lead iodide ($PbI_2$), 26.9 mg methylamonnium bromide (MABr), 88.1 mg lead bromide ($PbBr_2$). 0.8 mL and 0.2 mL of anhydrous diethylformamide and anhydrous dimethysulfoxide was added to the salt precursors. The molar ratios of the salts were 1 FAI: 1.1 $PbI_2$: 0.2 MABr: 0.2 $PbBr_2$. The salts were dissolved by vortexing for 5 to 10 minutes. Finally, 40 µL of 1.5 M cesium iodide solution was added.

The solution was spin-coated in a $N_2$ glovebox by coating the substrate layer and spinning at 1000 rpm for 10 seconds then 3000 rpm for 12 seconds. 0.5 mL of chlorobenzene was dripped over the course of approximately 1 second when 12 seconds remain in the spin cycle. The film was annealed for 1 hour in a $N_2$ glovebox at 100° C. The film converted to a tinted (brown/black) phase in approximately 60 seconds. Octakis(4-methoxyphenyl)-9,9-spirobi[9H-fluorene]-2,2,7,7-tetramine (SPIRO-MeOTAD) solution was prepared with 72 mg of SPIRO, 17.5 µL of 520 mg/ml stock solution of lithium bis(trifluoromethane)sulfonimide (LiTFSI) salt in acetonitrile, and 28.8 µL 4-tertbutylpyradine. The solution was spin-coated onto the perovskite layer at 5000 rpm for 30 s.

The PV device 2000 was completed by dry transfer of a PEDOT:PSS hole transport layer 2200. PEDOT:PSS (Clevios PH1000) was spin cast onto pre-cleaned and UV-ozone-treated quartz substrate layers and was then dried at 120° C. for 15 minutes. Surlfuric acid ($H_2SO_4$) treatment was performed by immersing the PEDOT:PSS films coated on the quartz substrate layers in a bath of concentrated $H_2SO_4$ (>95%) for 10 minutes at room temperature, followed by washing in a bath of deionized water. The films were then dried at 120° C. for 10 minutes. Carrier stamps were prepared by casting PDMS (Sylgard 184, Dow Corning) onto a glass petri dish. The PDMS stamps were then placed onto the $H_2SO_4$-treated PEDOT:PSS films, and subsequent peeling away of the PDMS stamps resulted in the transfer of the films onto the PDMS stamps. Finally, $H_2SO_4$-treated PEDOT:PSS films were transferred onto the target substrate layers by peeling away the PDMS stamps after annealing the target substrate layers at a temperature between 50 and 70° C. for 2 min. FIG. 22 shows the absorption and reflection (1-transmission) as a function of wavelength for the complete device in the tinted state (solid line) and in the transparent state (dashed line).

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A device comprising:
   a switchable perovskite material; and
   an intercalating species, wherein:
   when a first condition is met, the intercalating species is associated with the switchable perovskite material and the switchable perovskite material is substantially transparent and substantially colorless,
   when a second condition is met, at least a portion of the intercalating species is transferred from the switchable perovskite material and the switchable perovskite material is substantially opaque and substantially colored,
   the intercalating species comprises at least one of $RNH_2$, RR'NH, ROH, CO, or $CO_2$, and
   R and R' are organic functional groups.

2. The device of claim 1, wherein the switchable perovskite material has a structure corresponding to at least one of $ABX_3$, $ABX_4$, or $A_2BX_6$ where A comprises a first cation, B comprises a second cation, and X comprises an anion.

3. The device of claim 2, wherein the first cation comprises at least one of a monovalent cation or a divalent cation.

4. The device of claim 2, wherein the second cation comprises a metal that is in at least one of a 2+ oxidation state or a 4+ oxidation state.

5. The device of claim 2, wherein the anion comprises at least one of a halide or an oxide/chalcogenide.

6. The device of claim 2, wherein:
   the switchable perovskite material comprises $ABX_3$,
   A comprises $CH_3NH_3^+$,
   B comprises at least one of lead or nickel, and
   X comprises at least one of iodine or bromine.

7. The device of claim 1, wherein the intercalating species comprises $CH_3NH_2$.

8. The device of claim 1, wherein the first condition is achieved when the switchable perovskite material attains a first temperature below about 25° C.

9. The device of claim 1, wherein the second condition is achieved when the switchable perovskite material attains a second temperature above about 25° C.

10. The device of claim 1, wherein when in the second condition, the switchable perovskite material is colored black, green, or red.

11. The device of claim 1, wherein when in the first condition, the switchable perovskite material is transparent to light having a wavelength substantially within the visible spectrum.

12. The device of claim 1, wherein when the second condition is met, the switchable perovskite material absorbs at least a portion of light in the visible spectrum.

13. The device of claim 1, further comprising an intercalating species reservoir, wherein:
    the switchable perovskite material is in the form of a perovskite layer,
    the intercalating species reservoir is positioned adjacent to a first surface of the perovskite layer, and
    at least a fraction of the portion of the intercalating species is reversibly stored in the intercalating species reservoir.

14. The device of claim 13, wherein the intercalating species reservoir comprises at least one of an empty volume or an adsorbing material.

15. The device of claim 13, further comprising:
    a first transparent conducting oxide layer; and
    a second transparent conducting oxide layer, wherein:
    the perovskite layer is positioned between the first transparent conducting oxide layer and the second conducting oxide layer, and
    the first transparent conducting layer is positioned between the intercalating species reservoir and the perovskite layer.

16. The device of claim 15, wherein the first transparent conducting layer is configured to allow the reversible transfer of the intercalating species from the perovskite layer to the intercalating species reservoir, and from the intercalating species reservoir to the perovskite layer.

17. The device of claim 1, further comprising:
    a switching mechanism having a first position and a second position, wherein:
    when in the first position, the first condition is met, and
    when in the second position, the second condition is met.

18. A method comprising:
    reversibly switching a perovskite material between a first state and a second state by applying a first condition to the perovskite material resulting in the first state characterized by the intercalating of a plurality of species into the perovskite material; and applying a second condition to the perovskite material resulting in the second state characterized by the removing of at least a portion of the plurality of species from the perovskite material, wherein:

when in the first state, the perovskite material is substantially transparent to light in the visible spectrum, when in the second state, the perovskite material is substantially opaque to light in the visible spectrum, the plurality of species comprises at least one of $RNH_2$, RR'NH, ROH, CO, or $CO_2$, and R and R' are organic functional groups.

19. The method of claim 18, wherein the second condition is achieved by applying radiant energy to the perovskite material.

20. The method of claim 18, wherein first condition comprises equilibrating the perovskite material to a first temperature between about 0° C. and about 25° C.

21. The method of claim 18, wherein the second condition comprises equilibrating the perovskite material to a second temperature above about 35° C.

22. The method of claim 18, further comprising, during the removing, transporting the portion to a species reservoir.

23. The device of claim 2, wherein:
the switchable perovskite material comprises at least one of $MAPbI_3$, $MANiI_3$, $HANiI_3$, or $HANiBr_3$.

24. The device of claim 1, wherein the device is configured to generate electricity when at least one of the first condition is met or the second condition is met.

25. The method of claim 18, wherein the perovskite material comprises at least one of $MAPbI_3$, $MANiI_3$, $HANiI_3$, or $HANiBr_3$.

26. The method of claim 18, further comprising, during at least one of the first state or the second state, generating electricity.

* * * * *